(12) United States Patent
Nagamine et al.

(10) Patent No.: US 9,196,823 B2
(45) Date of Patent: Nov. 24, 2015

(54) MAGNETORESISTIVE EFFECT ELEMENT

(71) Applicant: KABUSHIKI KAISHA TOSHIBA, Minato-ku, Tokyo (JP)

(72) Inventors: Makoto Nagamine, Tokyo (JP); Daisuke Ikeno, Yokkaichi (JP); Koji Ueda, Fukuoka (JP); Katsuya Nishiyama, Yokohama (JP); Katsuaki Natori, Yokkaichi (JP); Koji Yamakawa, Tokyo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 142 days.

(21) Appl. No.: 14/019,415

(22) Filed: Sep. 5, 2013

(65) Prior Publication Data

US 2014/0085971 A1    Mar. 27, 2014

(30) Foreign Application Priority Data

Sep. 21, 2012  (JP) ................................. 2012-208788

(51) Int. Cl.
| | |
|---|---|
| *G11C 11/00* | (2006.01) |
| *H01L 43/02* | (2006.01) |
| *H01L 43/08* | (2006.01) |
| *H01L 43/10* | (2006.01) |
| *G11C 11/16* | (2006.01) |

(52) U.S. Cl.
CPC ............... *H01L 43/02* (2013.01); *H01L 43/08* (2013.01); *H01L 43/10* (2013.01); *G11C 11/161* (2013.01)

(58) Field of Classification Search
USPC ................................................ 365/148, 158
See application file for complete search history.

(56) References Cited

U.S. PATENT DOCUMENTS

| | | | | |
|---|---|---|---|---|
| 8,014,193 | B2* | 9/2011 | Nakayama et al. | 365/158 |
| 8,305,801 | B2* | 11/2012 | Daibou et al. | 365/171 |
| 8,335,059 | B2* | 12/2012 | Ishikawa et al. | 360/324.2 |
| 8,339,841 | B2* | 12/2012 | Iwayama | 365/158 |
| 2004/0257719 | A1 | 12/2004 | Ohba et al. | |
| 2007/0014149 | A1 | 1/2007 | Nagamine et al. | |

(Continued)

FOREIGN PATENT DOCUMENTS

| | | |
|---|---|---|
| JP | 2005-203774 A | 7/2005 |
| JP | 2007201059 A | 8/2007 |

(Continued)

OTHER PUBLICATIONS

Japanese Office Action dated Feb. 10, 2015, issued in counterpart Japanese Application No. 2012-208788.

*Primary Examiner* — Pho M Luu

(74) *Attorney, Agent, or Firm* — Holtz, Holtz, Goodman & Chick PC

(57) ABSTRACT

A magnetoresistive effect element includes the following structure. A first ferromagnetic layer has a variable magnetization direction. A second ferromagnetic layer has an invariable magnetization direction. A tunnel barrier layer is formed between the first and second ferromagnetic layers. An energy barrier between the first ferromagnetic layer and the tunnel barrier layer is higher than an energy barrier between the second ferromagnetic layer and the tunnel barrier layer. The second ferromagnetic layer contains a main component and an additive element. The main component contains at least one of Fe, Co, and Ni. The additive element contains at least one of Mg, Al, Ca, Sc, Ti, V, Mn, Zn, As, Sr, Y, Zr, Nb, Cd, In, Ba, La, Ce, Pr, Nd, Sm, Eu, Gd, Tb, Dy, Ho, Er, Tm, Yb, Lu, Hf, Ta, and W.

16 Claims, 21 Drawing Sheets

(56) References Cited

U.S. PATENT DOCUMENTS

| | | |
|---|---|---|
| 2008/0239586 A1 | 10/2008 | Takagishi et al. |
| 2009/0161267 A1 | 6/2009 | Kawai et al. |
| 2009/0190264 A1 | 7/2009 | Fukuzawa et al. |
| 2010/0109061 A1 | 5/2010 | Kushida et al. |
| 2012/0063217 A1 | 3/2012 | Hosomi et al. |
| 2012/0069640 A1 | 3/2012 | Nagase et al. |

FOREIGN PATENT DOCUMENTS

| | | |
|---|---|---|
| JP | 2008243327 A | 10/2008 |
| JP | 2009182130 A | 8/2009 |
| JP | 2010114143 A | 5/2010 |
| JP | 2010177256 A | 8/2010 |
| JP | 2011114151 A | 6/2011 |
| JP | 2011-138954 A | 7/2011 |

* cited by examiner

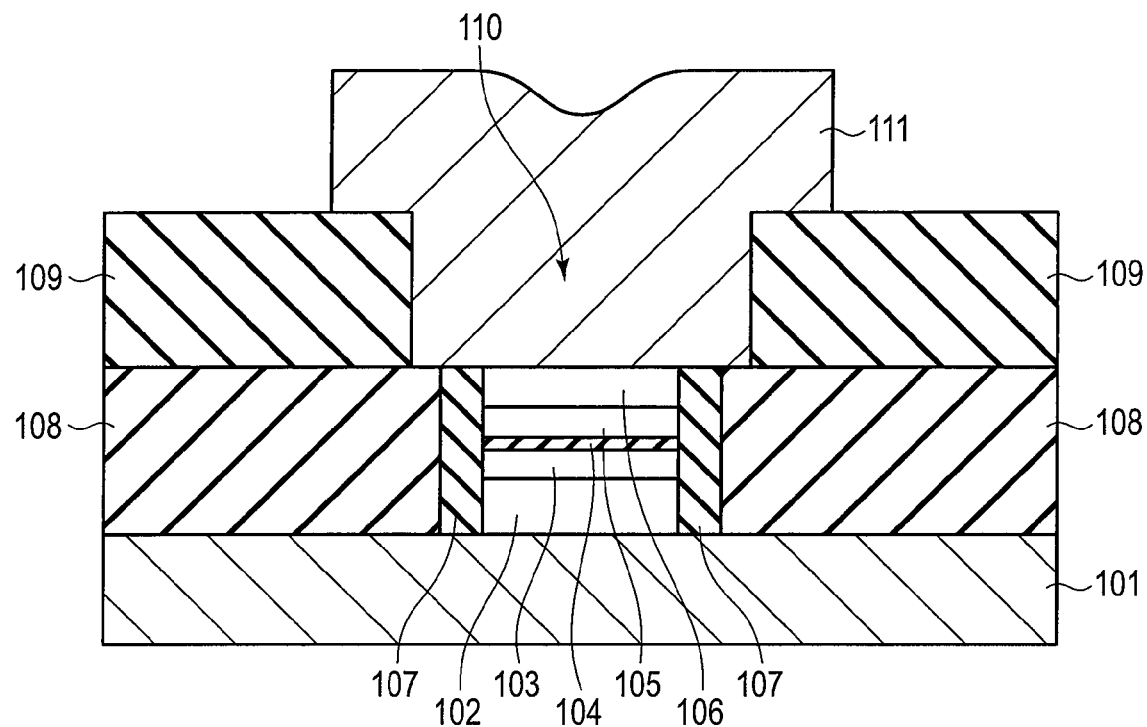
F I G. 1
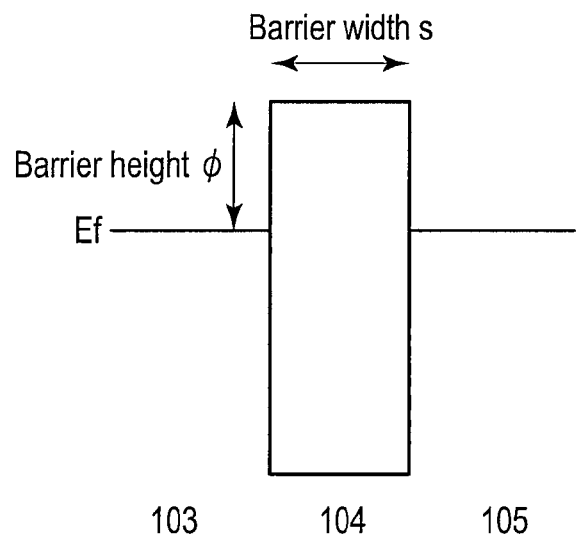
F I G. 2

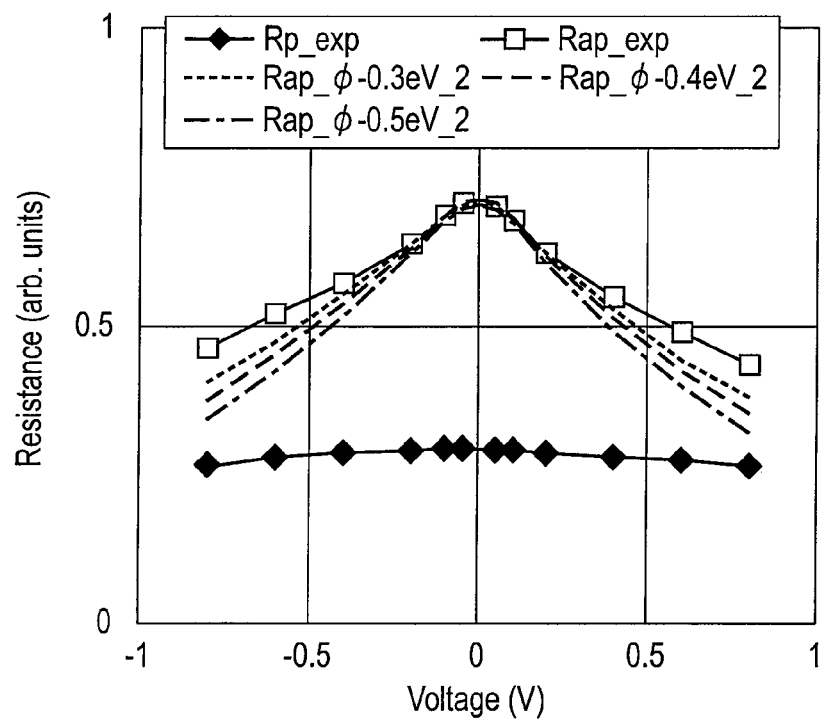
F I G. 4A
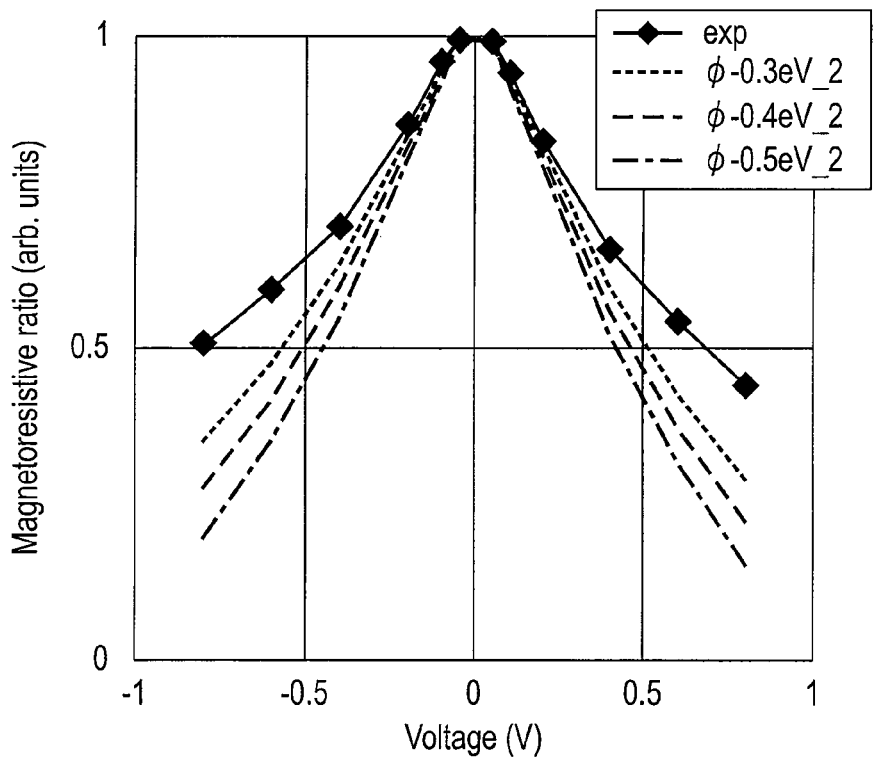
F I G. 4B

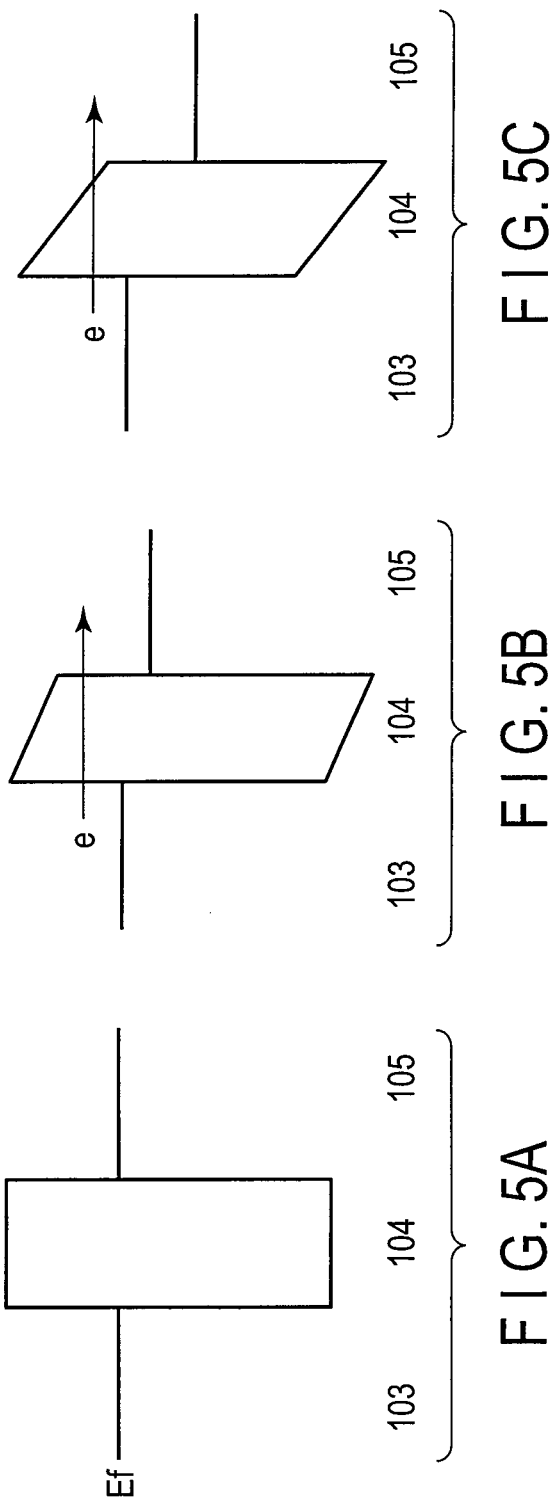

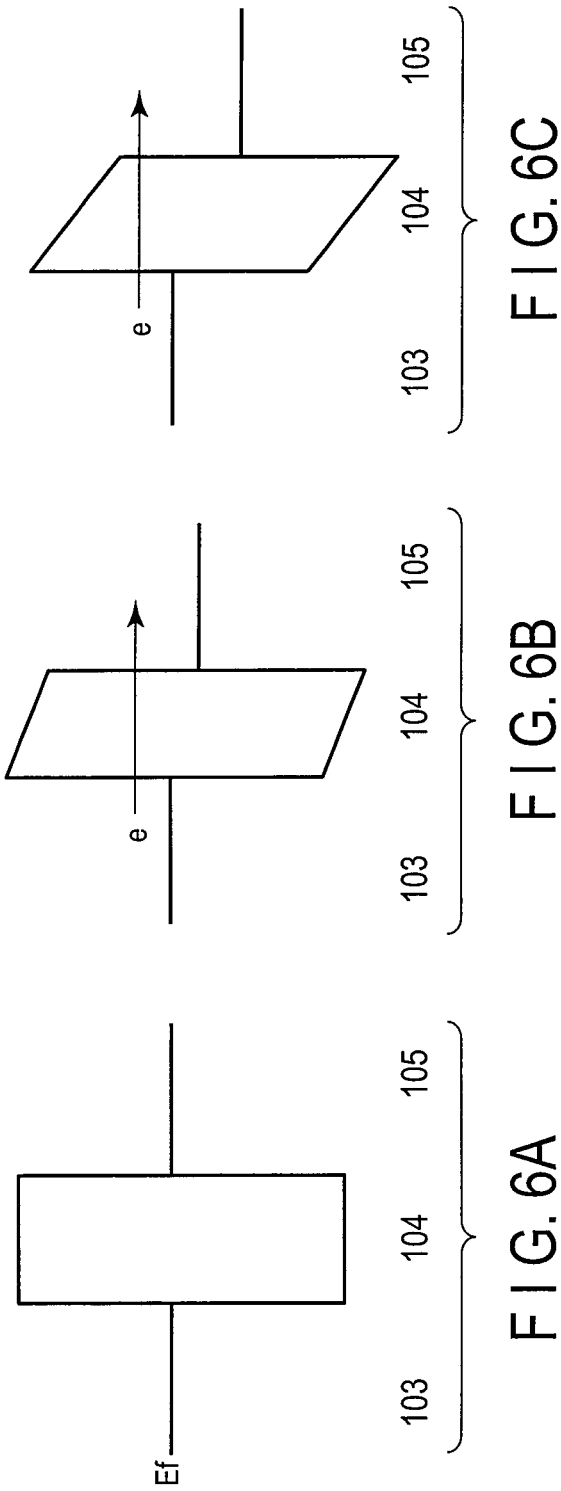

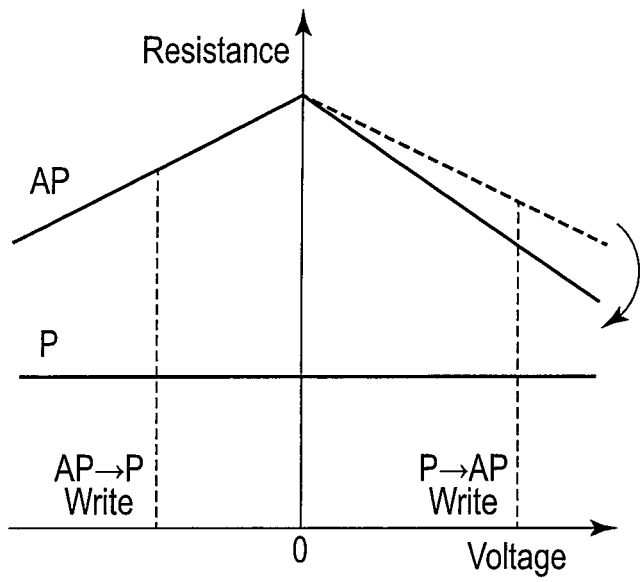
F I G. 9
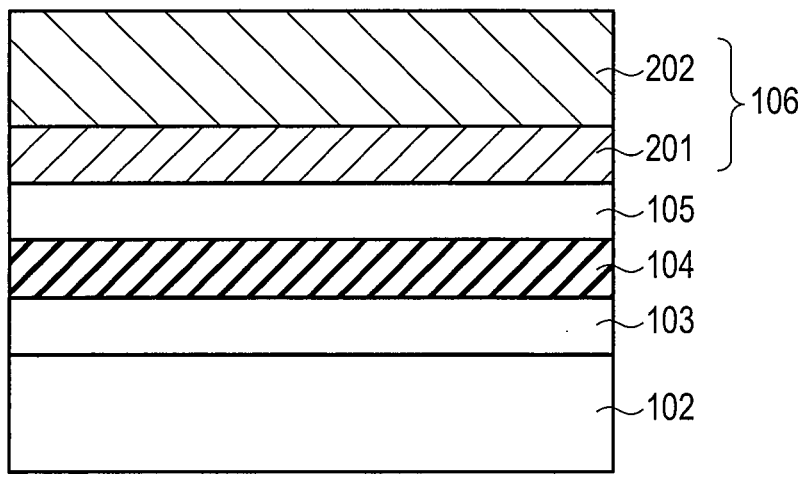
F I G. 10

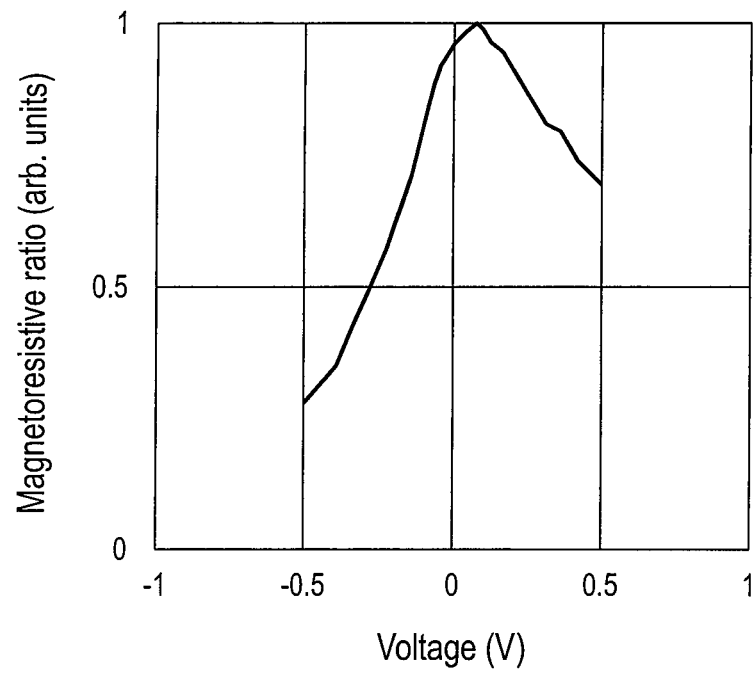
F I G. 11A
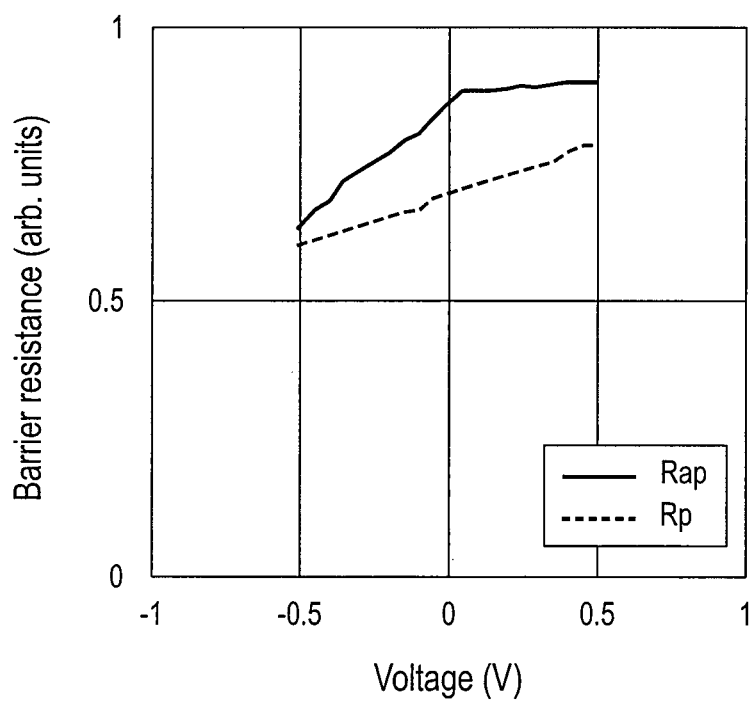
F I G. 11B

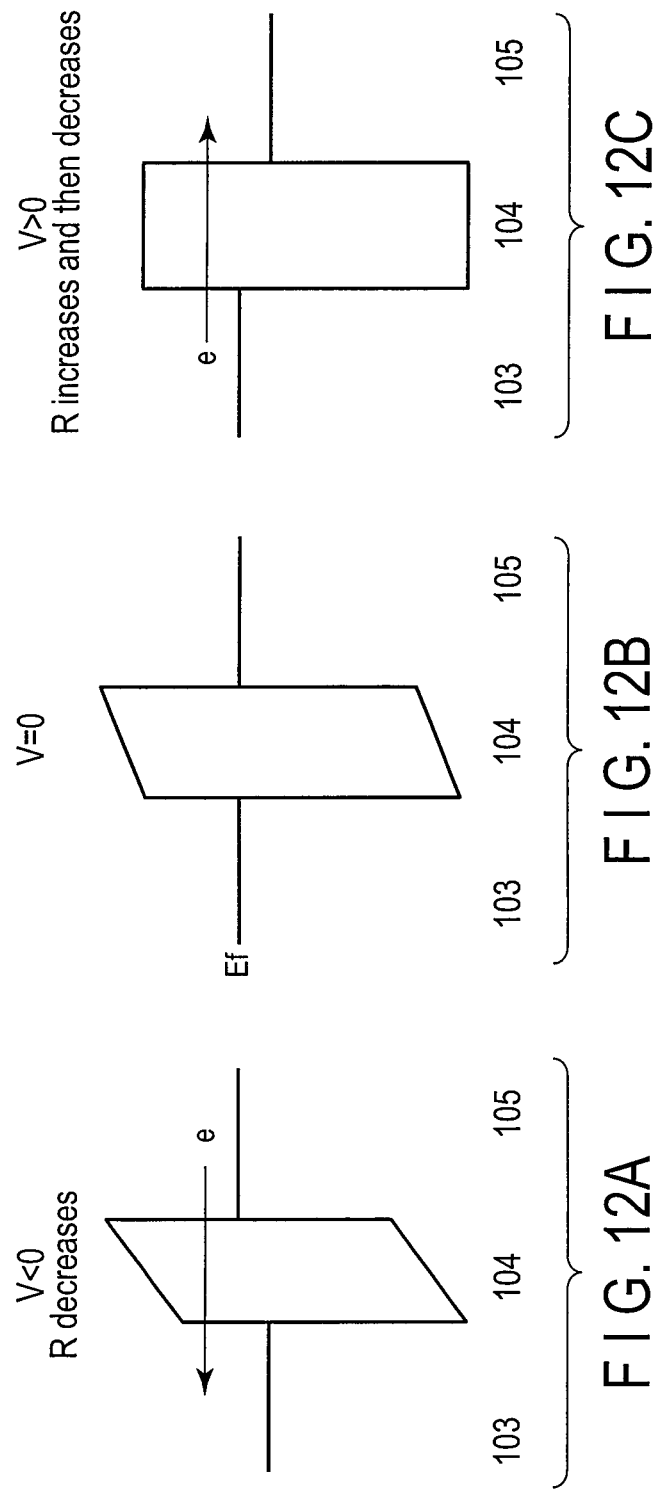

| Ferromagnetic layer material → | | Co | Fe | Ni | CoB | CoB | CoB | FeB | FeB | FeB | NiB | NiB | NiB | CoFe | CoFe | CoFe | CoFe | CoFe | CoFe | NiFe | NiFe | NiFe | NiFe | NiFe | NiFe |
|---|---|---|---|---|---|---|---|---|---|---|---|---|---|---|---|---|---|---|---|---|---|---|---|---|---|
| Ferromagnetic layer base material | Element | Co | Fe | Ni | CoB | CoB | CoB | FeB | FeB | FeB | NiB | NiB | NiB | CoFe | CoFe | CoFe | CoFe | CoFe | CoFe | NiFe | NiFe | NiFe | NiFe | NiFe | NiFe |
| | Work function (eV) | 5 | 4.67 | 5.22 | | | | | | | | | | | | | | | | | | | | | |
| | | | | | | Component ratio (%) | | | | | | | | | | | | | | | | | | | |
| | Co | 100 | 0 | 0 | 80 | 90 | 0 | 0 | 0 | 0 | 0 | 0 | 10 | 20 | 50 | 80 | 90 | 0 | 0 | 0 | 0 | 0 | 0 |
| | Fe | 0 | 100 | 0 | 0 | 0 | 80 | 90 | 0 | 0 | 90 | 80 | 20 | 50 | 20 | 10 | 10 | 20 | 50 | 80 | 90 |
| | Ni | 0 | 0 | 100 | 20 | 10 | 0 | 0 | 0 | 0 | 80 | 20 | 10 | 0 | 0 | 0 | 0 | 0 | 0 | 0 | 0 | 90 | 80 | 50 | 20 | 10 |
| | B | 0 | 0 | 0 | 20 | 10 | 20 | 10 | 20 | 10 | 0 | 0 | 0 | 0 | 0 | 0 | 0 | 0 | 0 |
| | Si | 0 | | | | | | | | | | | | | | | | | | | | | | | | |
| | Mn | 0 | | | | | | | | | | | | | | | | | | | | | | | | |
| Average work function (eV) → | | 5 | 4.67 | 5.22 | 4.89 | 4.95 | 4.63 | 4.65 | 5.07 | 5.14 | 4.70 | 4.74 | 4.84 | 4.93 | 4.97 | 5.17 | 5.11 | 4.95 | 4.78 | 4.73 |
| | Element | Work function (eV) | | | | | Work function difference from base material (eV) | | | | | | | | | | | | | | | | | | |
| Additive element | Mg | 3.66 | 1.3 | 1.0 | 1.6 | 1.2 | 1.3 | 1.0 | 1.0 | 1.4 | 1.5 | 1.0 | 1.1 | 1.2 | 1.3 | 1.3 | 1.5 | 1.5 | 1.3 | 1.1 |
| | Al | 4.06 | 0.9 | 0.6 | 1.2 | 0.8 | 0.9 | 0.6 | 0.6 | 1.0 | 1.1 | 0.6 | 0.7 | 0.8 | 0.9 | 0.9 | 1.1 | 1.1 | 0.9 | 0.7 |
| | Ca | 2.87 | 2.1 | 1.8 | 2.4 | 2.0 | 2.1 | 1.8 | 1.8 | 2.2 | 2.3 | 1.8 | 1.9 | 2.0 | 2.1 | 2.1 | 2.3 | 2.2 | 2.1 | 1.9 |
| | Sc | 3.5 | 1.5 | 1.2 | 1.7 | 1.4 | 1.4 | 1.1 | 1.1 | 1.6 | 1.6 | 1.2 | 1.3 | 1.4 | 1.4 | 1.5 | 1.7 | 1.6 | 1.4 | 1.2 |
| | Ti | 4.33 | 0.7 | 0.3 | 0.9 | 0.6 | 0.6 | 0.3 | 0.3 | 0.7 | 0.8 | 0.4 | 0.5 | 0.6 | 0.6 | 0.6 | 0.8 | 0.8 | 0.6 | 0.4 |
| | V | 4.3 | 0.7 | 0.4 | 0.9 | 0.6 | 0.6 | 0.3 | 0.3 | 0.8 | 0.8 | 0.4 | 0.5 | 0.6 | 0.7 | 0.7 | 0.9 | 0.8 | 0.6 | 0.4 |
| | Cr | 4.5 | 0.5 | 0.2 | 0.7 | 0.4 | 0.4 | 0.1 | 0.1 | 0.6 | 0.6 | 0.2 | 0.3 | 0.4 | 0.5 | 0.5 | 0.7 | 0.6 | 0.4 | 0.2 |
| | Mn | 4.1 | 0.9 | 0.6 | 1.1 | 0.8 | 0.8 | 0.5 | 0.5 | 1.0 | 1.0 | 0.6 | 0.7 | 0.8 | 0.8 | 0.9 | 1.1 | 1.0 | 0.8 | 0.6 |
| | Zn | 3.63 | 1.4 | 1.0 | 1.6 | 1.3 | 1.3 | 1.0 | 1.0 | 1.4 | 1.5 | 1.1 | 1.2 | 1.3 | 1.3 | 1.3 | 1.5 | 1.5 | 1.3 | 1.1 |
| | Ga | 4.32 | 0.7 | 0.4 | 0.9 | 0.6 | 0.6 | 0.3 | 0.3 | 0.7 | 0.8 | 0.4 | 0.5 | 0.6 | 0.6 | 0.6 | 0.8 | 0.8 | 0.6 | 0.4 |
| | As | 3.75 | 1.3 | 0.9 | 1.5 | 1.1 | 1.2 | 0.9 | 0.9 | 1.3 | 1.4 | 1.0 | 1.1 | 1.2 | 1.2 | 1.4 | 1.4 | 1.2 | 1.0 |
| | Sr | 2.59 | 2.4 | 2.1 | 2.6 | 2.3 | 2.4 | 2.0 | 2.1 | 2.5 | 2.6 | 2.1 | 2.2 | 2.3 | 2.4 | 2.4 | 2.6 | 2.5 | 2.4 | 2.2 |
| | Y | 3.1 | 1.9 | 1.6 | 2.1 | 1.8 | 1.8 | 1.5 | 1.5 | 2.0 | 2.0 | 1.6 | 1.7 | 1.8 | 1.9 | 2.1 | 2.0 | 1.8 | 1.7 |
| | Zr | 4.05 | 1.0 | 0.6 | 1.2 | 0.8 | 0.9 | 0.6 | 0.6 | 1.0 | 1.1 | 0.7 | 0.7 | 0.8 | 0.9 | 0.9 | 1.1 | 1.1 | 0.9 | 0.7 |
| | Nb | 4.02 | 1.0 | 0.7 | 1.2 | 0.9 | 0.9 | 0.6 | 0.6 | 1.0 | 1.1 | 0.7 | 0.7 | 0.8 | 0.9 | 0.9 | 1.1 | 1.1 | 0.9 | 0.7 |
| | Mo | 4.53 | 0.5 | 0.1 | 0.7 | 0.4 | 0.4 | 0.1 | 0.1 | 0.5 | 0.6 | 0.2 | 0.2 | 0.3 | 0.4 | 0.4 | 0.6 | 0.6 | 0.4 | 0.3 |
| | Cd | 4.08 | 0.9 | 0.6 | 1.1 | 0.8 | 0.9 | 0.5 | 0.6 | 1.0 | 1.1 | 0.6 | 0.7 | 0.8 | 0.9 | 0.9 | 1.1 | 1.2 | 0.9 | 0.6 |
| | In | 4.09 | 0.9 | 0.6 | 1.1 | 0.8 | 0.9 | 0.5 | 0.6 | 1.0 | 1.1 | 0.6 | 0.7 | 0.8 | 0.9 | 0.9 | 1.1 | 1.1 | 0.9 | 0.6 |
| | Sn | 4.42 | 0.6 | 0.3 | 0.8 | 0.5 | 0.5 | 0.2 | 0.2 | 0.6 | 0.7 | 0.3 | 0.3 | 0.5 | 0.5 | 0.7 | 0.7 | 0.5 | 0.4 |
| | Sb | 4.55 | 0.5 | 0.1 | 0.7 | 0.3 | 0.4 | 0.1 | 0.1 | 0.5 | 0.6 | 0.2 | 0.2 | 0.4 | 0.4 | 0.6 | 0.6 | 0.4 | 0.2 |
| | Ba | 2.52 | 2.5 | 2.2 | 2.7 | 2.4 | 2.4 | 2.1 | 2.1 | 2.5 | 2.6 | 2.2 | 2.2 | 2.3 | 2.4 | 2.4 | 2.6 | 2.6 | 2.4 | 2.3 | 2.2 |

| | | Co | Fe | Ni | CoB | CoB | FeB | FeB | NiB | NiB | CoFe | CoFe | CoFe | CoFe | CoFe | NiFe | NiFe | NiFe | NiFe | NiFe |
|---|---|---|---|---|---|---|---|---|---|---|---|---|---|---|---|---|---|---|---|---|
| Ferromagnetic layer base material | Element / Work function (eV) | | | | | | | | | | | | | | | | | | | |
| | Co / 5 | 100 | 0 | 0 | 80 | 90 | 0 | 0 | 0 | 0 | 10 | 20 | 50 | 80 | 90 | 0 | 0 | 0 | 0 | 0 |
| | Fe / 4.67 | 0 | 100 | 0 | 0 | 0 | 80 | 90 | 0 | 0 | 90 | 80 | 50 | 20 | 10 | 10 | 20 | 50 | 80 | 90 |
| | Ni / 5.22 | 0 | 0 | 100 | 0 | 0 | 0 | 0 | 80 | 90 | 0 | 0 | 0 | 0 | 0 | 90 | 80 | 50 | 20 | 10 |
| | B / 4.45 | 0 | 0 | 0 | 20 | 10 | 20 | 10 | 20 | 10 | 0 | 0 | 0 | 0 | 0 | 0 | 0 | 0 | 0 | 0 |
| | Si / 4.6 | 0 | 0 | 0 | 0 | 0 | 0 | 0 | 0 | 0 | 0 | 0 | 0 | 0 | 0 | 0 | 0 | 0 | 0 | 0 |
| | Mn / 4.1 | 0 | 0 | 0 | 0 | 0 | 0 | 0 | 0 | 0 | 0 | 0 | 0 | 0 | 0 | 0 | 0 | 0 | 0 | 0 |
| | Average work function (eV) | 5 | 4.67 | 5.22 | 4.89 | 4.95 | 4.63 | 4.65 | 5.07 | 5.14 | 4.70 | 4.74 | 4.84 | 4.93 | 4.97 | 5.17 | 5.11 | 4.95 | 4.78 | 4.73 |
| Additive element | Element / Work function (eV) | Work function difference from base material (eV) | | | | | | | | | | | | | | | | | | |
| | La / 3.5 | 1.5 | 1.2 | 1.7 | 1.4 | 1.4 | 1.1 | 1.1 | 1.6 | 1.6 | 1.2 | 1.2 | 1.3 | 1.4 | 1.5 | 1.7 | 1.6 | 1.4 | 1.3 | 1.2 |
| | Ce / 2.9 | 2.1 | 1.8 | 2.3 | 2.0 | 2.0 | 1.7 | 1.7 | 2.2 | 2.2 | 1.8 | 1.8 | 1.9 | 2.0 | 2.1 | 2.3 | 2.2 | 2.0 | 1.9 | 1.8 |
| | Pr / 2.7 | 2.3 | 2.0 | 2.5 | 2.2 | 2.2 | 1.9 | 1.9 | 2.4 | 2.4 | 2.0 | 2.0 | 2.1 | 2.2 | 2.3 | 2.5 | 2.4 | 2.2 | 2.1 | 2.0 |
| | Nd / 3.2 | 1.8 | 1.5 | 2.0 | 1.7 | 1.7 | 1.4 | 1.4 | 1.9 | 1.9 | 1.5 | 1.5 | 1.6 | 1.7 | 1.8 | 2.0 | 1.9 | 1.7 | 1.6 | 1.5 |
| | Sm / 2.7 | 2.3 | 2.0 | 2.5 | 2.2 | 2.2 | 1.9 | 1.9 | 2.4 | 2.4 | 2.0 | 2.0 | 2.1 | 2.2 | 2.3 | 2.5 | 2.4 | 2.2 | 2.1 | 2.0 |
| | Eu / 2.5 | 2.5 | 2.2 | 2.7 | 2.4 | 2.4 | 2.1 | 2.1 | 2.6 | 2.6 | 2.2 | 2.3 | 2.3 | 2.4 | 2.5 | 2.7 | 2.6 | 2.4 | 2.3 | 2.2 |
| | Gd / 2.9 | 2.1 | 1.8 | 2.3 | 2.0 | 2.0 | 1.7 | 1.7 | 2.2 | 2.2 | 1.8 | 1.8 | 1.9 | 2.0 | 2.1 | 2.3 | 2.2 | 2.0 | 1.9 | 1.8 |
| | Tb / 3 | 2.0 | 1.7 | 2.2 | 1.9 | 1.9 | 1.6 | 1.6 | 2.1 | 2.1 | 1.7 | 1.7 | 1.8 | 1.9 | 2.0 | 2.2 | 2.1 | 1.9 | 1.8 | 1.7 |
| | Dy / 3.1 | 1.9 | 1.6 | 2.1 | 1.8 | 1.8 | 1.5 | 1.5 | 2.0 | 2.0 | 1.6 | 1.6 | 1.7 | 1.8 | 1.9 | 2.1 | 2.0 | 1.8 | 1.7 | 1.6 |
| | Ho / 3.1 | 1.9 | 1.6 | 2.1 | 1.8 | 1.8 | 1.5 | 1.5 | 2.0 | 2.0 | 1.6 | 1.6 | 1.7 | 1.8 | 1.9 | 2.1 | 2.0 | 1.8 | 1.7 | 1.6 |
| | Er / 3.2 | 1.8 | 1.5 | 2.0 | 1.7 | 1.7 | 1.4 | 1.4 | 1.9 | 1.9 | 1.5 | 1.5 | 1.6 | 1.7 | 1.8 | 2.0 | 1.9 | 1.7 | 1.6 | 1.5 |
| | Tm / 3.2 | 1.8 | 1.5 | 2.0 | 1.7 | 1.7 | 1.4 | 1.4 | 1.9 | 1.9 | 1.5 | 1.5 | 1.6 | 1.7 | 1.8 | 2.0 | 1.9 | 1.7 | 1.6 | 1.5 |
| | Yb / 2.6 | 2.4 | 2.1 | 2.6 | 2.3 | 2.3 | 2.0 | 2.0 | 2.5 | 2.5 | 2.1 | 2.1 | 2.2 | 2.3 | 2.4 | 2.6 | 2.5 | 2.3 | 2.2 | 2.1 |
| | Lu / 3.3 | 1.7 | 1.4 | 1.9 | 1.6 | 1.6 | 1.3 | 1.3 | 1.8 | 1.8 | 1.4 | 1.4 | 1.5 | 1.6 | 1.7 | 1.9 | 1.8 | 1.6 | 1.5 | 1.4 |
| | Hf / 3.9 | 1.1 | 0.8 | 1.3 | 1.0 | 1.0 | 0.7 | 0.7 | 1.2 | 1.2 | 0.8 | 0.8 | 0.9 | 1.0 | 1.1 | 1.3 | 1.2 | 1.0 | 0.9 | 0.8 |
| | Ta / 4.25 | 0.8 | 0.4 | 1.0 | 0.6 | 0.7 | 0.4 | 0.4 | 0.8 | 0.9 | 0.5 | 0.5 | 0.6 | 0.7 | 0.7 | 0.9 | 0.9 | 0.7 | 0.5 | 0.5 |
| | W / 4.55 | 0.5 | 0.1 | 0.7 | 0.3 | 0.4 | 0.1 | 0.1 | 0.5 | 0.6 | 0.2 | 0.2 | 0.3 | 0.4 | 0.4 | 0.6 | 0.6 | 0.4 | 0.2 | 0.2 |
| | Ti / 3.84 | 1.2 | 0.8 | 1.4 | 1.1 | 1.1 | 0.8 | 0.8 | 1.2 | 1.3 | 0.9 | 0.9 | 1.0 | 1.1 | 1.1 | 1.3 | 1.3 | 1.1 | 0.9 | 0.9 |
| | Pb / 4.25 | 0.8 | 0.4 | 1.0 | 0.6 | 0.7 | 0.4 | 0.4 | 0.8 | 0.9 | 0.5 | 0.5 | 0.6 | 0.7 | 0.7 | 0.9 | 0.9 | 0.7 | 0.5 | 0.5 |
| | Bi / 4.34 | 0.7 | 0.3 | 0.9 | 0.6 | 0.6 | 0.3 | 0.3 | 0.7 | 0.8 | 0.4 | 0.4 | 0.5 | 0.6 | 0.6 | 0.8 | 0.8 | 0.6 | 0.4 | 0.4 |
| | Pt / 5.64 | −0.6 | −1.0 | −0.4 | −0.8 | −0.7 | −1.0 | −1.0 | −0.6 | −0.5 | −0.9 | −0.9 | −0.8 | −0.7 | −0.7 | −0.5 | −0.5 | −0.7 | −0.9 | −0.9 |

F I G. 15

| Ferromagnetic layer material→ | | CoNi | CoNi | CoNi | CoNi | CoNi | CoFeB | CoFeB | CoFeB | CoFeB | CoFeB | CoFeB | CoFeB | CoFeNi | CoFeNi | CoFeNi | CoFeSi | CoMnSi |
|---|---|---|---|---|---|---|---|---|---|---|---|---|---|---|---|---|---|---|
| Ferromagnetic base material | Element | Work function (eV) | Component ratio (%) | | | | | | | | | | | | | | | |
| | Co | 5 | 10 | 20 | 50 | 80 | 90 | 40 | 45 | 60 | 20 | 24 | 56 | 8 | 72 | 8 | 50 | 50 |
| | Fe | 4.67 | 0 | 0 | 0 | 0 | 0 | 40 | 45 | 20 | 60 | 56 | 24 | 72 | 8 | 72 | 50 | 25 |
| | Ni | 5.22 | 90 | 80 | 50 | 20 | 10 | 0 | 0 | 0 | 0 | 0 | 0 | 0 | 0 | 10 | 0 | 0 |
| | B | 4.45 | 0 | 0 | 0 | 0 | 0 | 20 | 10 | 20 | 20 | 20 | 20 | 20 | 20 | 0 | 0 | 0 |
| | Si | 4.6 | 0 | 0 | 0 | 0 | 0 | 0 | 0 | 0 | 0 | 0 | 0 | 0 | 0 | 0 | 25 | 25 |
| | Mn | 4.1 | 0 | 0 | 0 | 0 | 0 | 0 | 0 | 0 | 0 | 0 | 0 | 0 | 0 | 0 | 0 | 0 |
| | Average work function (eV)→ | | 5.20 | 5.18 | 5.11 | 5.04 | 5.02 | 4.76 | 4.80 | 4.82 | 4.69 | 4.71 | 4.81 | 4.65 | 4.86 | 4.50 | 4.28 | 5.36 | 4.82 | 4.68 |
| Additive element | Element | Work function (eV) | Work function difference from base material (eV) | | | | | | | | | | | | | | | |
| | Mg | 3.66 | 1.5 | 1.5 | 1.5 | 1.4 | 1.4 | 1.1 | 1.1 | 1.2 | 1.0 | 1.0 | 1.2 | 1.0 | 1.2 | 0.8 | 0.6 | 1.2 | 1.0 |
| | Al | 4.06 | 1.1 | 1.1 | 1.1 | 1.0 | 1.0 | 0.7 | 0.7 | 0.8 | 0.6 | 0.6 | 0.8 | 0.6 | 0.8 | 0.4 | 0.2 | 0.8 | 0.6 |
| | Ca | 2.87 | 2.3 | 2.3 | 2.2 | 2.2 | 2.2 | 1.9 | 1.9 | 2.0 | 1.8 | 1.8 | 1.9 | 1.8 | 2.0 | 1.6 | 1.4 | 1.9 | 1.8 |
| | Sc | 3.5 | 1.7 | 1.7 | 1.6 | 1.5 | 1.5 | 1.3 | 1.3 | 1.3 | 1.2 | 1.2 | 1.3 | 1.2 | 1.4 | 1.0 | 0.8 | 1.3 | 1.2 |
| | Ti | 4.33 | 0.9 | 0.8 | 0.8 | 0.7 | 0.7 | 0.4 | 0.5 | 0.5 | 0.4 | 0.4 | 0.5 | 0.3 | 0.5 | 0.2 | 0.0 | 0.5 | 0.3 |
| | V | 4.3 | 0.9 | 0.9 | 0.8 | 0.7 | 0.7 | 0.5 | 0.5 | 0.5 | 0.4 | 0.4 | 0.5 | 0.4 | 0.6 | 0.2 | 0.0 | 0.5 | 0.4 |
| | Cr | 4.5 | 0.7 | 0.7 | 0.6 | 0.5 | 0.5 | 0.3 | 0.3 | 0.3 | 0.2 | 0.2 | 0.3 | 0.2 | 0.4 | 0.0 | -0.2 | 0.3 | 0.2 |
| | Mn | 4.1 | 1.1 | 1.1 | 1.0 | 0.9 | 0.9 | 0.7 | 0.7 | 0.7 | 0.6 | 0.6 | 0.7 | 0.6 | 0.8 | 0.4 | 0.2 | 0.7 | — |
| | Zn | 3.63 | 1.6 | 1.5 | 1.5 | 1.4 | 1.4 | 1.2 | 1.2 | 1.2 | 1.1 | 1.1 | 1.2 | 1.0 | 1.2 | 0.9 | 0.7 | 1.2 | 1.0 |
| | Ga | 4.32 | 0.9 | 0.9 | 0.8 | 0.7 | 0.7 | 0.4 | 0.5 | 0.5 | 0.4 | 0.4 | 0.5 | 0.3 | 0.5 | 0.2 | 0.0 | 0.5 | 0.4 |
| | As | 3.75 | 1.4 | 1.4 | 1.4 | 1.3 | 1.3 | 1.0 | 1.0 | 1.1 | 0.9 | 1.0 | 1.1 | 0.9 | 1.1 | 0.7 | 0.5 | 1.1 | 0.9 |
| | Sr | 2.59 | 2.6 | 2.6 | 2.5 | 2.5 | 2.4 | 2.2 | 2.2 | 2.2 | 2.1 | 2.1 | 2.2 | 2.1 | 2.3 | 1.9 | 1.7 | 2.2 | 2.1 |
| | Y | 3.1 | 2.1 | 2.1 | 2.0 | 1.9 | 1.9 | 1.7 | 1.7 | 1.7 | 1.6 | 1.6 | 1.7 | 1.6 | 1.8 | 1.4 | 1.2 | 1.7 | 1.6 |
| | Zr | 4.05 | 1.1 | 1.1 | 1.1 | 1.0 | 1.0 | 0.7 | 0.7 | 0.8 | 0.6 | 0.7 | 0.8 | 0.6 | 0.8 | 0.4 | 0.2 | 0.8 | 0.6 |
| | Nb | 4.02 | 1.2 | 1.2 | 1.1 | 1.0 | 1.0 | 0.7 | 0.8 | 0.8 | 0.7 | 0.7 | 0.8 | 0.6 | 0.8 | 0.5 | 0.3 | 0.8 | 0.7 |
| | Mo | 4.53 | 0.7 | 0.6 | 0.6 | 0.5 | 0.5 | 0.2 | 0.3 | 0.3 | 0.2 | 0.2 | 0.3 | 0.1 | 0.3 | 0.0 | -0.2 | 0.3 | 0.1 |
| | Cd | 4.08 | 1.1 | 1.1 | 1.0 | 1.0 | 0.9 | 0.7 | 0.7 | 0.7 | 0.6 | 0.6 | 0.7 | 0.6 | 0.8 | 0.4 | 0.2 | 0.7 | 0.6 |
| | In | 4.09 | 1.1 | 1.1 | 1.0 | 1.0 | 0.9 | 0.7 | 0.7 | 0.7 | 0.6 | 0.6 | 0.7 | 0.6 | 0.8 | 0.4 | 0.2 | 0.7 | 0.6 |
| | Sn | 4.42 | 0.8 | 0.8 | 0.7 | 0.6 | 0.6 | 0.3 | 0.4 | 0.4 | 0.3 | 0.3 | 0.4 | 0.2 | 0.4 | 0.1 | -0.1 | 0.4 | 0.3 |
| | Sb | 4.55 | 0.6 | 0.6 | 0.6 | 0.5 | 0.5 | 0.2 | 0.2 | 0.3 | 0.1 | 0.2 | 0.3 | 0.1 | 0.3 | -0.1 | -0.3 | 0.3 | 0.1 |
| | Ba | 2.52 | 2.7 | 2.7 | 2.6 | 2.5 | 2.5 | 2.2 | 2.3 | 2.3 | 2.2 | 2.2 | 2.3 | 2.1 | 2.3 | 2.0 | 1.8 | 2.3 | 2.2 |

| Ferromagnetic layer material → | | CoNi | CoNi | CoNi | CoNi | CoNi | CoFeB | CoFeB | CoFeB | CoFeB | CoFeB | CoFeB | CoFeB | CoFeB | CoFeNi | CoFeNi | CoFeNi | CoFeSi | CoMnSi |
|---|---|---|---|---|---|---|---|---|---|---|---|---|---|---|---|---|---|---|---|
| Element | Work function (eV) | | | | | | Component ratio (%) | | | | | | | | | | | | |
| Co | 5 | 10 | 20 | 50 | 80 | 90 | 40 | 45 | 60 | 20 | 24 | 56 | 8 | 72 | 72 | 8 | 50 | 50 | 50 |
| Fe | 4.67 | 0 | 0 | 0 | 0 | 0 | 40 | 45 | 20 | 60 | 56 | 24 | 72 | 8 | 8 | 72 | 50 | 25 | 0 |
| Ni | 5.22 | 90 | 80 | 50 | 20 | 10 | 0 | 0 | 0 | 0 | 0 | 0 | 0 | 0 | 10 | 10 | 0 | 0 | 0 |
| B | 4.45 | 0 | 0 | 0 | 0 | 0 | 20 | 10 | 20 | 20 | 20 | 20 | 20 | 20 | 0 | 0 | 0 | 0 | 0 |
| Si | 4.6 | 0 | 0 | 0 | 0 | 0 | 0 | 0 | 0 | 0 | 0 | 0 | 0 | 0 | 0 | 0 | 0 | 25 | 25 |
| Mn | 4.1 | 0 | 0 | 0 | 0 | 0 | 0 | 0 | 0 | 0 | 0 | 0 | 0 | 0 | 0 | 0 | 0 | 0 | 25 |
| Average work function (eV) → | | 5.20 | 5.18 | 5.11 | 5.04 | 5.02 | 4.76 | 4.80 | 4.82 | 4.69 | 4.71 | 4.81 | 4.65 | 4.86 | 4.50 | 4.28 | 5.36 | 4.82 | 4.68 |
| Element | Work function (eV) | | | | | | Work function difference from base material (eV) | | | | | | | | | | | | |
| La | 3.5 | 1.7 | 1.7 | 1.6 | 1.5 | 1.5 | 1.3 | 1.3 | 1.3 | 1.2 | 1.2 | 1.3 | 1.2 | 1.4 | 1.0 | 0.8 | 1.9 | 1.3 | 1.2 |
| Ce | 2.9 | 2.3 | 2.3 | 2.2 | 2.1 | 2.1 | 1.9 | 1.9 | 1.9 | 1.8 | 1.8 | 1.9 | 1.8 | 2.0 | 1.6 | 1.4 | 2.5 | 1.9 | 1.8 |
| Pr | 2.7 | 2.5 | 2.5 | 2.4 | 2.3 | 2.3 | 2.1 | 2.1 | 2.1 | 2.0 | 2.0 | 2.1 | 2.0 | 2.2 | 1.8 | 1.6 | 2.7 | 2.1 | 2.0 |
| Nd | 3.2 | 2.0 | 2.0 | 1.9 | 1.8 | 1.8 | 1.6 | 1.6 | 1.6 | 1.5 | 1.5 | 1.6 | 1.5 | 1.7 | 1.3 | 1.1 | 2.2 | 1.6 | 1.5 |
| Sm | 2.7 | 2.5 | 2.5 | 2.4 | 2.3 | 2.3 | 2.1 | 2.1 | 2.1 | 2.0 | 2.0 | 2.1 | 2.0 | 2.2 | 1.8 | 1.6 | 2.7 | 2.1 | 2.0 |
| Eu | 2.5 | 2.7 | 2.7 | 2.6 | 2.5 | 2.5 | 2.3 | 2.3 | 2.3 | 2.2 | 2.2 | 2.3 | 2.2 | 2.4 | 2.0 | 1.8 | 2.9 | 2.3 | 2.2 |
| Gd | 2.9 | 2.3 | 2.3 | 2.2 | 2.1 | 2.1 | 1.9 | 1.9 | 1.9 | 1.8 | 1.8 | 1.9 | 1.8 | 2.0 | 1.6 | 1.4 | 2.5 | 1.9 | 1.8 |
| Tb | 3 | 2.2 | 2.2 | 2.1 | 2.0 | 2.0 | 1.8 | 1.8 | 1.8 | 1.7 | 1.7 | 1.8 | 1.7 | 1.9 | 1.5 | 1.3 | 2.4 | 1.8 | 1.7 |
| Dy | 3.1 | 2.1 | 2.1 | 2.0 | 1.9 | 1.9 | 1.7 | 1.7 | 1.7 | 1.6 | 1.6 | 1.7 | 1.6 | 1.8 | 1.4 | 1.2 | 2.3 | 1.7 | 1.6 |
| Ho | 3.1 | 2.1 | 2.1 | 2.0 | 1.9 | 1.9 | 1.7 | 1.7 | 1.7 | 1.6 | 1.6 | 1.7 | 1.6 | 1.8 | 1.4 | 1.2 | 2.3 | 1.7 | 1.6 |
| Er | 3.2 | 2.0 | 2.0 | 1.9 | 1.8 | 1.8 | 1.6 | 1.6 | 1.6 | 1.5 | 1.5 | 1.6 | 1.5 | 1.7 | 1.3 | 1.1 | 2.2 | 1.6 | 1.5 |
| Tm | 3.2 | 2.0 | 2.0 | 1.9 | 1.8 | 1.8 | 1.6 | 1.6 | 1.6 | 1.5 | 1.5 | 1.6 | 1.5 | 1.7 | 1.3 | 1.1 | 2.2 | 1.6 | 1.5 |
| Yb | 2.6 | 2.6 | 2.6 | 2.5 | 2.4 | 2.4 | 2.2 | 2.2 | 2.2 | 2.1 | 2.1 | 2.2 | 2.1 | 2.3 | 1.9 | 1.7 | 2.8 | 2.2 | 2.1 |
| Lu | 3.3 | 1.9 | 1.9 | 1.8 | 1.7 | 1.7 | 1.5 | 1.5 | 1.5 | 1.4 | 1.4 | 1.5 | 1.4 | 1.6 | 1.2 | 1.0 | 2.1 | 1.5 | 1.4 |
| Hf | 3.9 | 1.3 | 1.3 | 1.2 | 1.1 | 1.1 | 0.9 | 0.9 | 0.9 | 0.8 | 0.8 | 0.9 | 0.8 | 1.0 | 0.6 | 0.4 | 1.5 | 0.9 | 0.8 |
| Ta | 4.25 | 0.9 | 0.9 | 0.9 | 0.8 | 0.8 | 0.5 | 0.5 | 0.6 | 0.4 | 0.5 | 0.6 | 0.4 | 0.6 | 0.2 | 0.0 | 1.1 | 0.6 | 0.4 |
| W | 4.55 | 0.6 | 0.6 | 0.6 | 0.5 | 0.5 | 0.2 | 0.2 | 0.3 | 0.1 | 0.2 | 0.3 | 0.1 | 0.3 | -0.1 | -0.3 | 0.8 | 0.3 | 0.1 |
| Ti | 3.84 | 1.4 | 1.3 | 1.3 | 1.2 | 1.2 | 0.9 | 1.0 | 1.0 | 0.9 | 0.9 | 1.0 | 0.8 | 1.0 | 0.7 | 0.4 | 1.5 | 1.0 | 0.8 |
| Pb | 4.25 | 0.9 | 0.9 | 0.9 | 0.8 | 0.8 | 0.5 | 0.5 | 0.6 | 0.4 | 0.5 | 0.6 | 0.4 | 0.6 | 0.2 | 0.0 | 1.1 | 0.6 | 0.4 |
| Bi | 4.34 | 0.9 | 0.8 | 0.8 | 0.7 | 0.7 | 0.4 | 0.5 | 0.5 | 0.4 | 0.4 | 0.5 | 0.3 | 0.5 | 0.2 | -0.1 | 1.0 | 0.5 | 0.3 |
| Pt | 5.64 | -0.4 | -0.5 | -0.5 | -0.6 | -0.6 | -0.9 | -0.8 | -0.8 | -0.9 | -0.9 | -0.8 | -1.0 | -0.8 | -1.1 | -1.4 | -0.3 | -0.8 | -1.0 |

FIG. 16

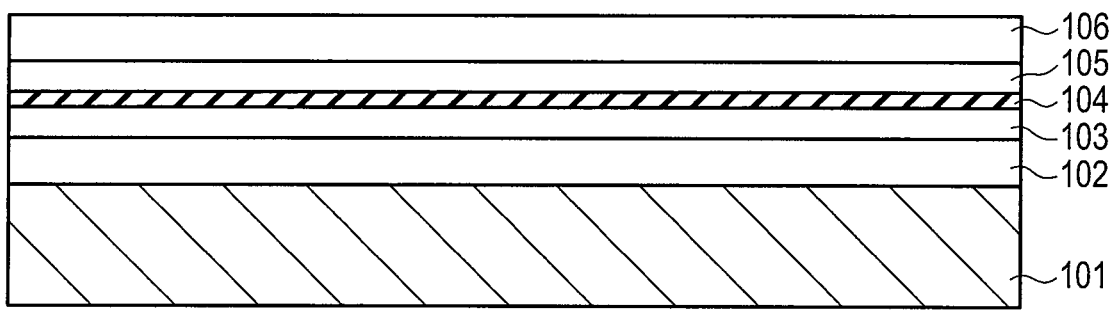
F I G. 17

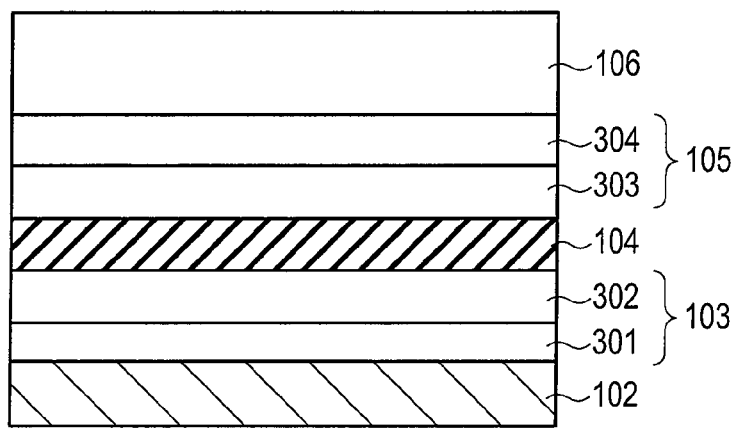
F I G. 18A
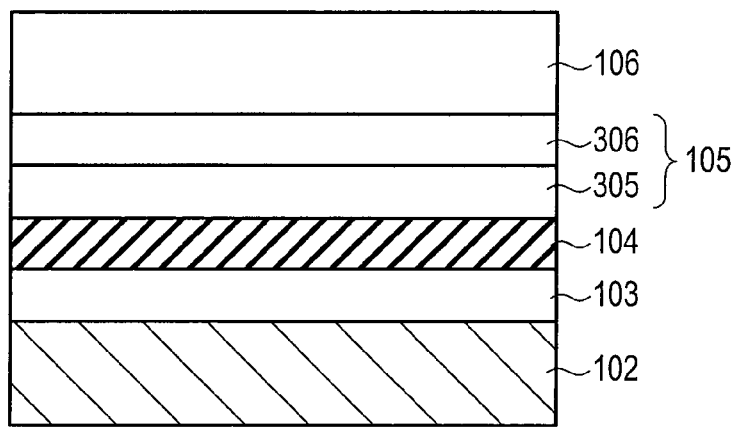
F I G. 18B
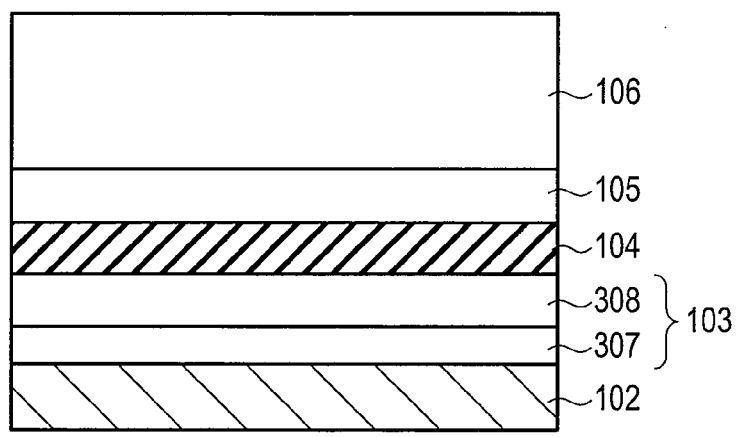
F I G. 18C

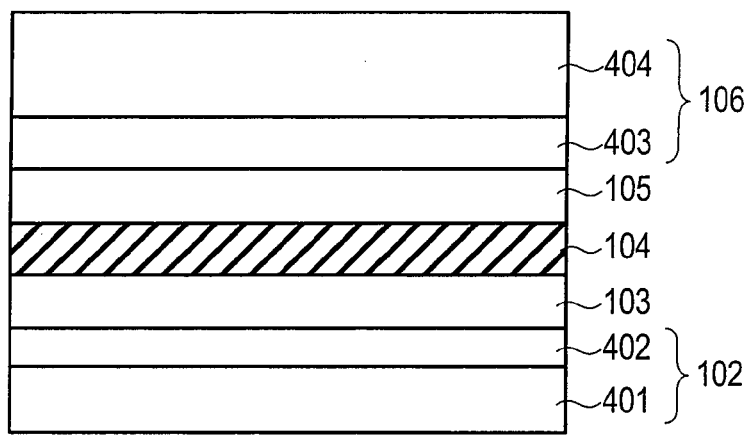
F I G. 19A
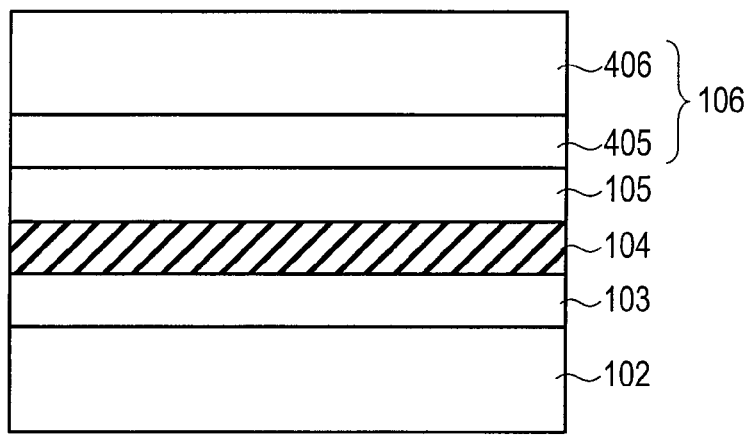
F I G. 19B
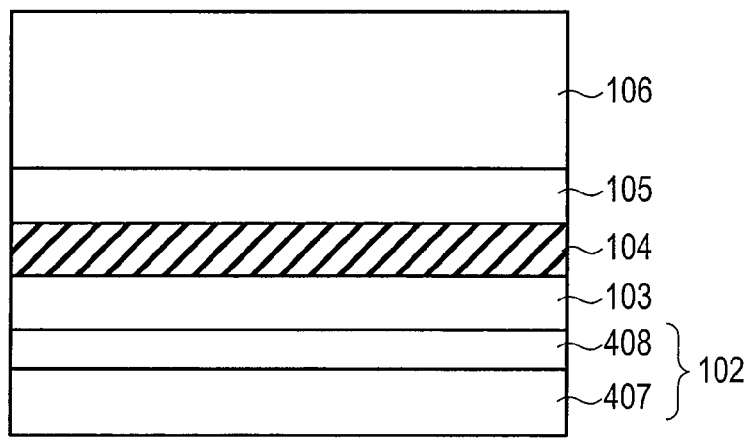
F I G. 19C

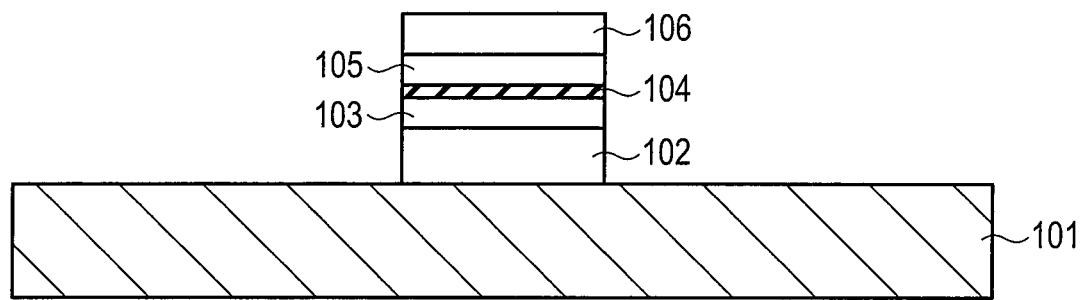
F I G. 20
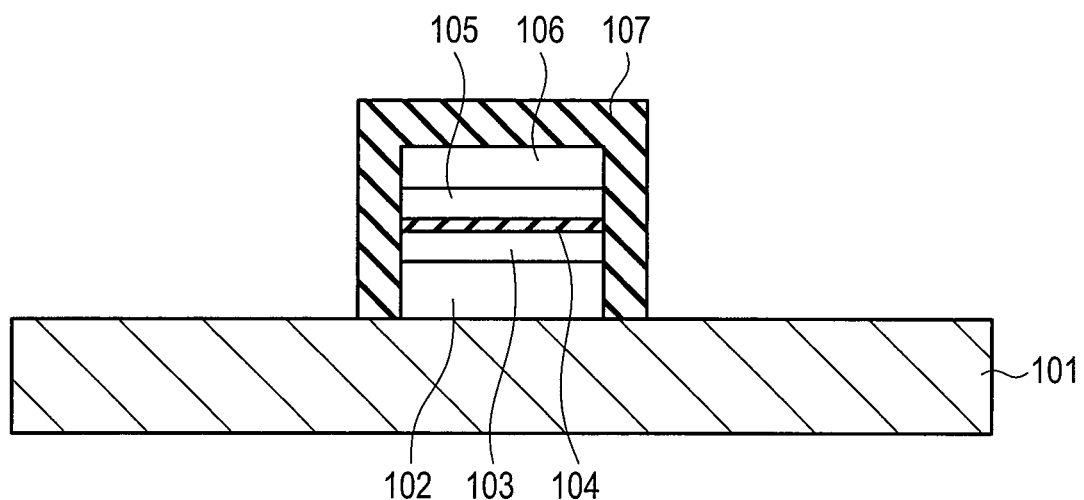
F I G. 21

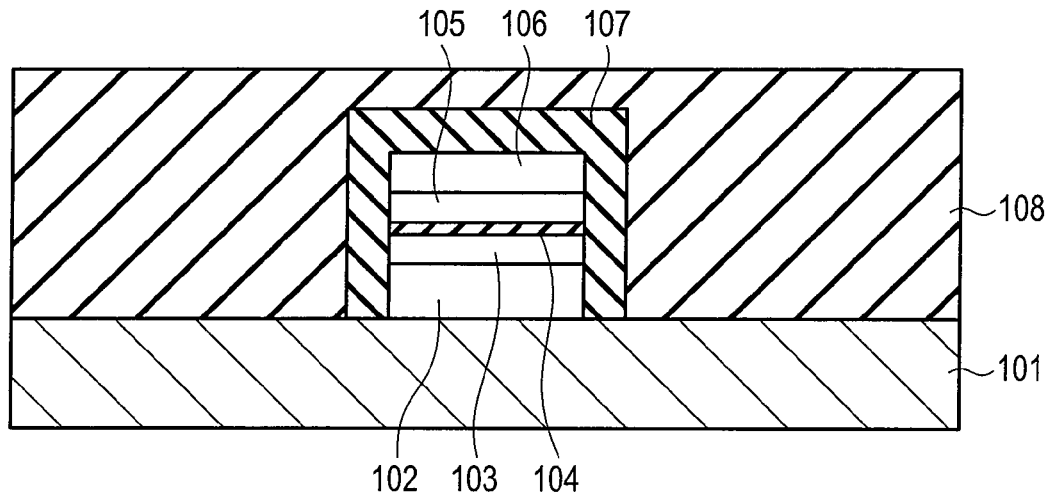
F I G. 22
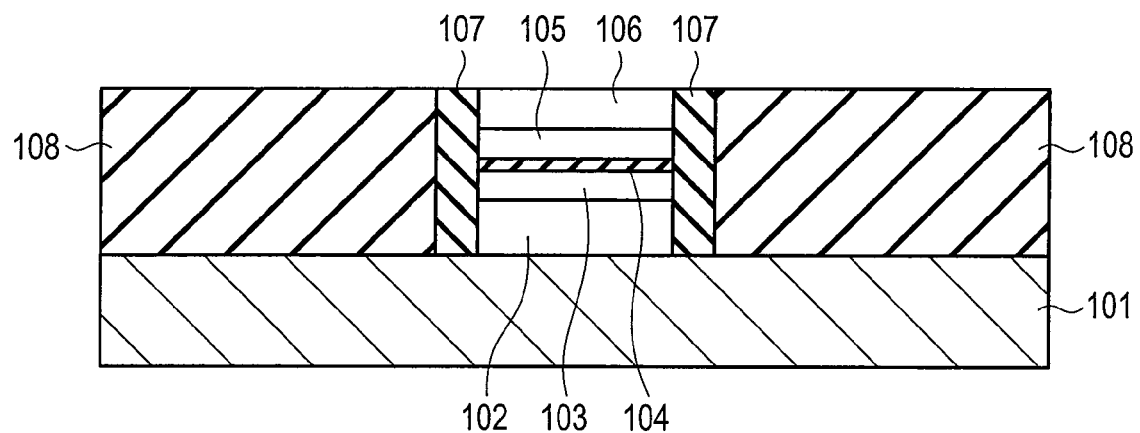
F I G. 23

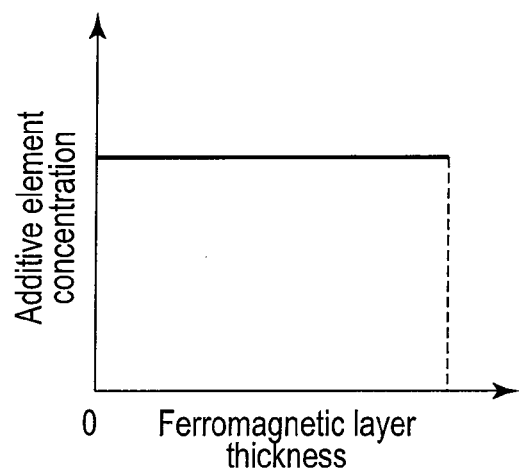
F I G. 26A
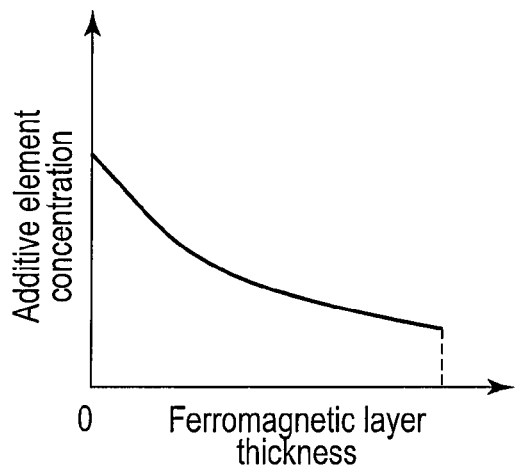
F I G. 26B
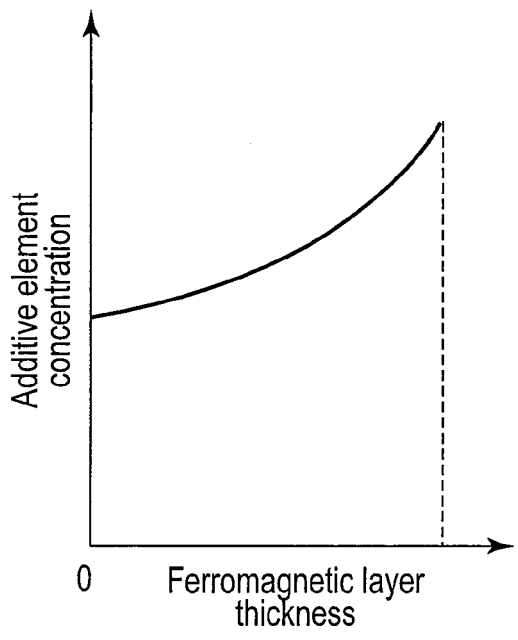
F I G. 26C

MAGNETORESISTIVE EFFECT ELEMENT

CROSS-REFERENCE TO RELATED APPLICATIONS

This application is based upon and claims the benefit of priority from Japanese Patent Application No. 2012-208788, filed Sep. 21, 2012, the entire contents of which are incorporated herein by reference.

FIELD

Embodiments described herein relate generally to a magnetoresistive effect element in which the electrical resistance changes in accordance with the direction of magnetization in a ferromagnetic material.

BACKGROUND

A magnetic random access memory (MRAM) is a memory device using a magnetic element having the magnetoresistive effect in a cell portion for storing data, and is attracting attention as a high-speed, large-capacity, nonvolatile next-generation memory device. The magnetoresistive effect is a phenomenon in which when a magnetic field is applied to a ferromagnetic material, the electrical resistance changes in accordance with the direction of magnetization in the ferromagnetic material. The device can be operated as a memory device (MRAM) by writing by using the magnetization direction in the ferromagnetic material, and reading in accordance with the magnitude of electrical resistance corresponding to the magnetization direction.

Recently, it has become possible to obtain a very high magnetoresistance ratio (MR ratio) of 100% or more by the tunnel magnetoresistive effect (TMR effect) in a ferromagnetic tunnel junction including a sandwiched structure in which a tunnel barrier made of MgO is inserted between two ferromagnetic layers made of CoFeB. By taking advantage of this, a large-capacity MRAM including a ferromagnetic tunnel junction (magnetic tunnel junction [MTJ]) element using the tunnel magnetoresistive effect is regarded as promising and attracting attention.

When using the MTJ element in the MRAM, one of the two ferromagnetic layers sandwiching the tunnel barrier is used as a reference layer by using a magnetization-fixed layer in which the magnetization direction is fixed to be invariable, and the other is used as a storage layer by using a magnetization free layer in which the magnetization direction readily reverses. Data can be stored by making a state in which the magnetization directions in the reference layer and storage layer are parallel and a state in which they are antiparallel correspond to "0" and "1" of binary numbers. The tunnel barrier resistance (barrier resistance) is lower and a tunnel current is larger when the magnetization directions are parallel than when they are antiparallel. The MR ratio is represented by "(resistance in antiparallel state—resistance in parallel state)/resistance in parallel state".

Stored data is read by detecting a resistance change caused by the TMR effect. Accordingly, the magnetoresistance ratio (MR ratio) obtained by the TMR effect is preferably high when reading. In contrast, data is written to a large-capacity MRAM by supplying a write current to the MTJ element, and switching the magnetization direction in the storage layer by the spin-transfer torque method. When writing, therefore, the MR ratio is preferably low because the write voltage is suppressed if the magnetization directions are antiparallel and the barrier resistance is high. A write requires a larger current than a read, so the absolute write voltage is larger than the absolute read voltage.

From the foregoing, the MR ratio is preferably high at a low voltage for a read and low at a high voltage for a write, i.e., the dependence of the MR ratio on the bias voltage is preferably steep.

BRIEF DESCRIPTION OF THE DRAWINGS

FIG. 1 is a sectional view showing the structure of a magnetoresistive effect element of an embodiment;

FIG. 2 is a schematic view showing the band structure of an MTJ element according to the embodiment;

FIGS. 4A and 4B are graphs showing the characteristics of the magnetoresistive effect element of the embodiment;

FIGS. 5A, 5B, and 5C are schematic views showing the band structure when the barrier height of the MTJ element according to the embodiment is small;

FIGS. 6A, 6B, and 6C are schematic views showing the band structure when the barrier height of the MTJ element according to the embodiment is large;

FIG. 9 is a graph showing the dependence of the resistance on the bias voltage when the magnetoresistive effect element of the embodiment is in an antiparallel state and parallel state;

FIG. 10 is a sectional view showing the structure of a magnetoresistive effect element of a comparative example;

FIGS. 11A and 11B are graphs showing the characteristics of the magnetoresistive effect element of the comparative example;

FIGS. 12A, 12B, and 12C are schematic views showing the band structure of an MTJ element according to the comparative example;

FIGS. 13, 14, 15 and 16 are views showing work function differences between ferromagnetic materials forming ferromagnetic layer base materials and additive elements according to the embodiment;

FIG. 17 is a sectional view showing a manufacturing method of the magnetoresistive effect element of the embodiment;

FIGS. 18A, 18B, and 18C are sectional views showing the manufacturing method of the magnetoresistive effect element of the embodiment;

FIGS. 19A, 19B, and 19C are sectional views showing the manufacturing method of the magnetoresistive effect element of the embodiment;

FIGS. 20, 21, 22, 23, 24 and 25 are sectional views showing the manufacturing method of the magnetoresistive effect element of the embodiment; and FIGS. 26A, 26B, and 26C are graphs each showing an additive element concentration distribution in a ferromagnetic layer of the magnetoresistive effect element of the embodiment.

DETAILED DESCRIPTION

Figure 3A:
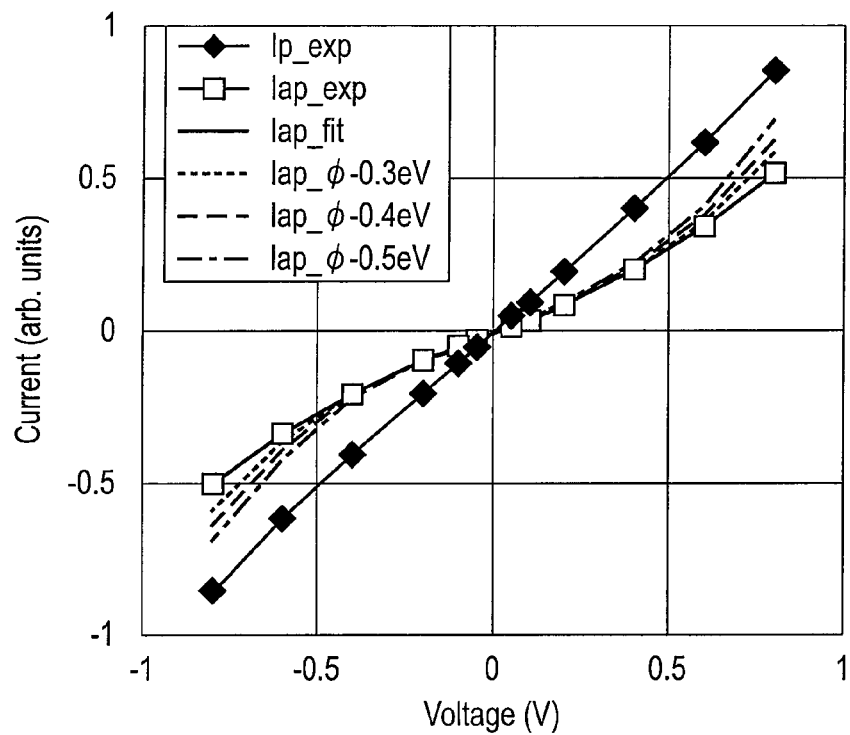
FIGS. 3A and 3B are graphs showing the characteristics of the magnetoresistive effect element of the embodiment.

A magnetoresistive effect element of an embodiment will be explained below with reference to the accompanying drawing. Note that in the following explanation, the same reference numbers denote constituent elements having the same functions and arrangements, and a repetitive explanation will be made only when necessary.

In general, according to one embodiment, a magnetoresistive effect element includes a first ferromagnetic layer, a second ferromagnetic layer and a tunnel barrier layer. The first ferromagnetic layer has a variable magnetization direction. The second ferromagnetic layer has an invariable magnetization direction. The tunnel barrier layer is formed between the first ferromagnetic layer and the second ferromagnetic layer. An energy barrier between the first ferromagnetic layer and the tunnel barrier layer is higher than an energy barrier between the second ferromagnetic layer and the tunnel barrier layer. The second ferromagnetic layer contains a main component and an additive element. The main component contains at least one of Fe, Co, and Ni. The additive element contains at least one of Mg, Al, Ca, Sc, Ti, V, Mn, Zn, As, Sr, Y, Zr, Nb, Cd, In, Ba, La, Ce, Pr, Nd, Sm, Eu, Gd, Tb, Dy, Ho, Er, Tm, Yb, Lu, Hf, Ta, and W.

FIG. 1 is a sectional view showing the structure of the magnetoresistive effect element of the embodiment.

As shown in FIG. 1, an underlayer 102, ferromagnetic layer 103, tunnel barrier layer 104, ferromagnetic layer 105, and upper layer 106 are formed in this order on a lower interconnect layer 101. The ferromagnetic layer 103, tunnel barrier layer 104, and ferromagnetic layer 105 form an MTJ element. That is, the MTJ element includes the ferromagnetic layers 103 and 105, and the tunnel barrier layer 104 sandwiched between the ferromagnetic layers 103 and 105.

Each of the ferromagnetic layers 103 and 105 is used as a storage layer or reference layer. For example, when the ferromagnetic layer 103 is used as a storage layer, the ferromagnetic layer 105 is used as a reference layer. When the ferromagnetic layer 103 is used as a reference layer, the ferromagnetic layer 105 is used as a storage layer. In the storage layer, the magnetization direction is variable and can be reversed. In the reference layer, the magnetization direction is invariable and fixed.

The underlayer 102 can also be used as the abovementioned reference layer or storage layer. The upper layer 106 can also be used as an etching mask, reference layer, surface protective layer, or upper interconnection connecting layer.

An insulating layer 107 as a protective film is formed on the side surfaces of the MTJ element including the ferromagnetic layer 103, tunnel barrier layer 104, and ferromagnetic layer 105, and on the side surfaces of the underlayer 102 and upper layer 106. Also, an interlayer dielectric film 108 is formed on the lower interconnect layer 101 around the insulating layer 107. An interlayer dielectric film 109 is formed on interlayer dielectric film 108.

A contact hole 110 is formed in interlayer dielectric film 109 above the MTJ element. An upper interconnect layer 111 is formed in the contact hole 110 above the upper layer 106. The lower interconnect layer 101 and upper interconnect layer 111 are spaced apart by interlayer dielectric films 108 and 109.

The ferromagnetic layers 103 and 105 contain a base material (main component) containing at least one of Fe, Co, and Ni, and an additive element. Note that both the ferromagnetic layers 103 and 105 need not always contain the main component and additive element, i.e., at least one of the ferromagnetic layers 103 and 105 need only contain the main component and additive element.

In this embodiment, the ferromagnetic layer 103 is used as a storage layer, and the ferromagnetic layer 105 is used as a reference layer. The content of the additive element in the interface between the ferromagnetic layer 105 and tunnel barrier layer 104 is larger than that in the interface between the ferromagnetic layer 103 and tunnel barrier layer 104.

The additive element has a work function smaller than the concentration weighted average of the work function of the main component. When an element having a work function smaller by 0.3 eV or more than the concentration weighted average of the work function of the main component is used as the additive element, the dependence of the magnetoresistance ratio (MR ratio) on the bias voltage can be made steep in the magnetoresistive effect element of this embodiment. The reason why the magnetoresistance ratio can be made steep will be described in detail later. The concentration weighted average of the work function means a work function obtained by averaging the concentrations of individual elements in the main component.

The additive element contains at least one of Mg, Al, Ca, Sc, Ti, V, Mn, Zn, As, Sr, Y, Zr, Nb, Cd, In, Ba, La, Ce, Pr, Nd, Sm, Eu, Gd, Tb, Dy, Ho, Er, Tm, Yb, Lu, Hf, Ta, and W.

Also, in a write operation, a positive bias is applied to the ferromagnetic layer 105 as a reference layer between the ferromagnetic layer 103 as a storage layer and the ferromagnetic layer 105. That is, a positive bias is applied to the ferromagnetic layer 105 in a write operation in which the magnetization in the ferromagnetic layer 103 is switched from a parallel state to an antiparallel state. The amount of additive element in the ferromagnetic layer 105 on the side of the upper interconnect layer 111, to which a positive voltage is applied, is larger than that in the ferromagnetic layer 103 on the side of the lower interconnect layer 101. Note that the additive element can be doped in both the ferromagnetic layers 103 and 105 and the amounts of the additive element can be different, or the additive element can be doped in only one of the ferromagnetic layers 103 and 105.

The magnetoresistive effect element of the embodiment having the above-described arrangement has the feature that the dependence of the magnetoresistance ratio on the bias voltage is steep.

The reason why the dependence of the MR ratio on the bias voltage is steep in the magnetoresistive effect element of the embodiment will be explained below.

FIG. 2 is a schematic view showing a band structure corresponding to the MTJ element (the ferromagnetic layer 103, tunnel barrier layer 104, and ferromagnetic layer 105) shown in FIG. 1. Ef is a Fermi-level energy corresponding to the upper-end energy of conduction electrons. A barrier height $\phi$ and barrier width s of the tunnel barrier layer 104 are defined as shown in FIG. 2.

Referring to FIGS. 3A, 3B, 4A, and 4B, the same material is used as the ferromagnetic layers 103 and 105. That is, the barrier height $\phi$ of the ferromagnetic layer 103 and tunnel barrier layer 104 and the barrier height $\phi$ of the ferromagnetic layer 105 and tunnel barrier layer 104 are equal.

FIG. 3A is a graph showing the current-voltage characteristics of the MTJ element shown in FIG. 1.

Ip is a current corresponding to the parallel state of magnetization, and Iap is a current corresponding to the antiparallel state of magnetization. The notation exp indicates an experimental value. While a current Ip_exp is almost directly proportional to the voltage, a current Iap_exp forms a cubic-function curve with respect to the voltage.

When current Iap_exp is fitted by cubic function $J=\theta(V+\gamma*V^3)$ by using the method of Simmons, a curve of a current Iap_fit is obtained, and the barrier height $\phi$ and barrier width s can be calculated from coefficients $\theta$ and $\gamma$ (J. G. Simmons, Journal of Applied Physics 34, 328 [1963]). J is the current density, and V is the voltage. Note that currents Iap_exp and Iap_fit are equal in FIG. 3A.

Currents Iap_φ−0.3 eV, Iap_φ−0.4 eV, and Iap_φ−0.5 eV indicate the current-voltage characteristics when the barrier height is decreased by 0.3, 0.4, and 0.5 eV, respectively, with respect to the fitting result of the experimental value by a method to be described below.

Figure 3B:
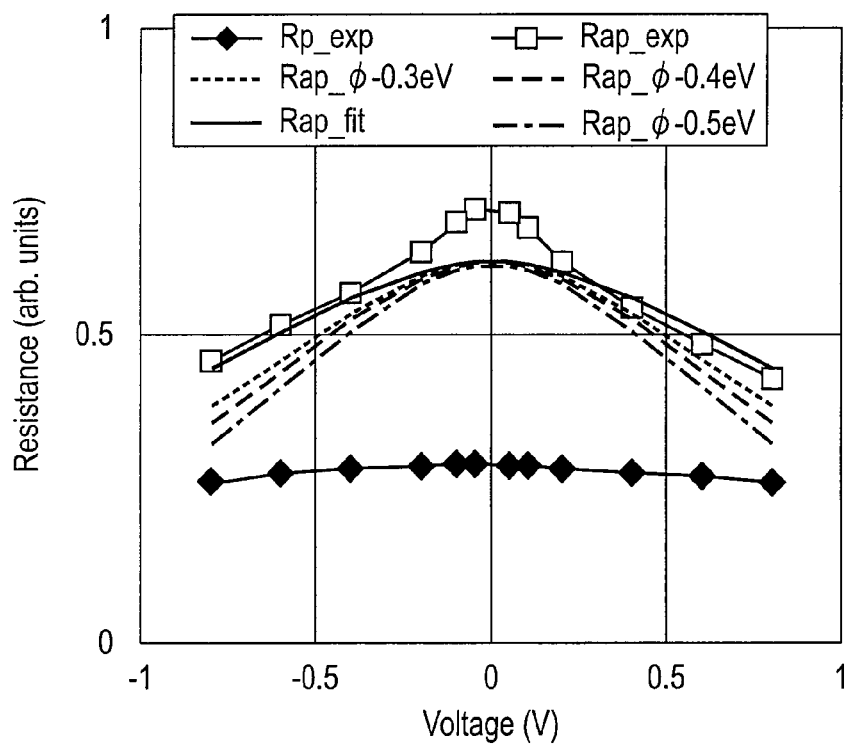

FIG. 3B is a graph showing the barrier resistance-voltage characteristics corresponding to FIG. 3A. The definitions of the suffixes are the same as in FIG. 3A.

If only the barrier height φ is decreased for the calculation results of the barrier height φ and barrier width s described above with reference to FIG. 3A, the barrier resistance significantly decreases over the entire bias range. To make the barrier resistances uniform near a voltage of zero (±0.05 V) and make the effect of decreasing the barrier height φ clearer, the barrier height φ is decreased and the barrier width s is increased as follows in each of FIGS. 3A, 3B, 4A, and 4B. When the barrier height φ is decreased while the barrier width s is held constant, the barrier resistances are not made uniform near a voltage of zero, and this makes it difficult to compare the dependences of the barrier resistances on the voltage. By contrast, when the barrier height φ is decreased while the barrier width s is increased, it is possible to make the barrier resistances uniform near a voltage of zero, and to facilitate comparing the dependences of the barrier resistances on the voltage.

ap_fit φ=1.385 eV s=1.008 nm
φ−0.3 eV φ=1.085 eV s=1.118 nm
φ−0.4 eV φ=0.985 eV s=1.165 nm
φ−0.5 eV φ=0.885 eV s=1.218 nm FIG. 4A shows the results of conversion performed on the resistance Rap in the antiparallel state by the following method for φ−0.3 eV, φ−0.4 ev, and φ−0.5 eV from FIG. 3B.

When the Simmons method described above is applied, the difference between the fitting result Rap_fit and experimental result Rap_exp increases near 0 V, as shown in FIG. 3B. To decrease this difference, the resistance Rap is converted by the following method in FIG. 4A.

(Rmax_φ−0.3 eV_2)=Rmax_exp×(Rmax_φ−0.3 eV)/Rmax_fit (Rmax_φ−0.4 eV_2)=Rmax_exp×(Rmax_φ−0.4 eV)/Rmax_fit (Rmax_φ−0.5 eV_2)=Rmax_exp×(Rmax_φ−0.5 eV)/Rmax_fit FIG. 4B is a graph showing the dependence of the MR ratio on the bias voltage, which is calculated from FIG. 4A.

As shown in FIGS. 4A and 4B, as the barrier height decreases, the dependence of the resistance on the bias voltage and the dependence of the MR ratio on the bias voltage become steep in the antiparallel state.

The reason why the dependence of the resistance on the bias voltage increases in the antiparallel state when the barrier height is small is presumably as follows.

FIGS. 5A, 5B, and 5C illustrate the band structure of the magnetoresistive effect element when the application voltage increases while the barrier height φ is small. FIGS. 6A, 6B, and 6C illustrate the band structure when the application voltage increases while the barrier height is large. FIGS. 5A and 6A illustrate a case in which there is no application voltage, FIGS. 5B and 6B illustrate a case in which the application voltage is low, and FIGS. 5C and 6C illustrate a case in which the application voltage is high. Note that, for example, the case in which the application voltage is low is equivalent to a case in which a read voltage is applied, and the case in which the application voltage is high is equivalent to a case in which a write voltage is applied.

As shown in FIGS. 5A, 5B, 5C, 6A, 6B, and 6C, when the barrier height is decreased, the contribution of electrons passing over the tunnel barrier layer 104 increases when the application voltage is high, and the barrier resistance decreases. By decreasing the barrier height, therefore, the dependence of the resistance Rap on the voltage in the antiparallel state becomes steep. When the resistance Rp in the parallel state can be held constant regardless of the voltage, the dependence of the MR ratio on the bias voltage becomes steep.

Although FIGS. 5A, 5B, 5C, 6A, 6B, and 6C illustrate cases in which the barrier heights φ on the sides of the ferromagnetic layers 103 and 105 are equal, the barrier heights φ may also be different.

Also, FIGS. 5A, 5B, 5C, 6A, 6B, and 6C illustrate cases in which a positive voltage is applied to the upper layer 106. However, even when a positive voltage is applied to the lower interconnect layer 101, the effect of making the dependence of the resistance on the voltage steep in the antiparallel state is obtained by decreasing the barrier height p.

Figure 7:
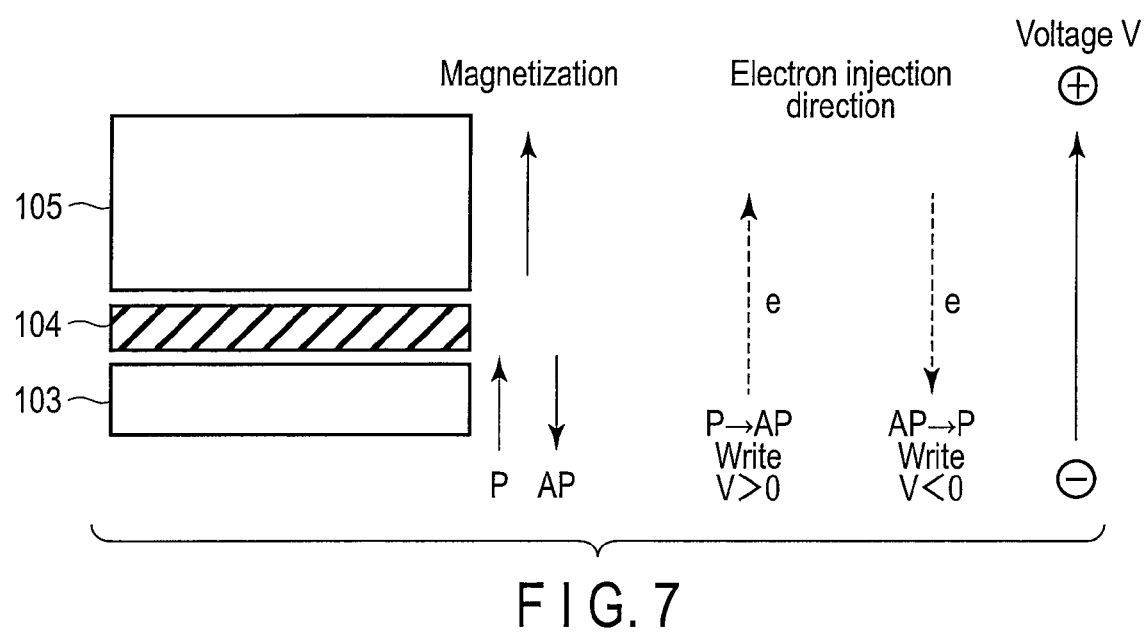
FIG. 7 is a view showing the magnetization direction and write voltage application direction in the magnetoresistive effect element of the embodiment.

FIG. 7 is a view showing the magnetization direction and write voltage application direction in the magnetoresistive effect element. A case in which the ferromagnetic layer 103 is used as a storage layer and the ferromagnetic layer 105 is used as a reference layer will be described below.

As shown in FIG. 7, in a write (P→AP) in which the magnetization directions change from parallel to antiparallel, a positive voltage is applied to the ferromagnetic layer 105 as a reference layer. In this state, electrons are injected into the ferromagnetic layer 105 from the ferromagnetic layer 103.

In contrast, in a write (AP→P) in which the magnetization directions change from antiparallel to parallel, a negative voltage is applied to the ferromagnetic layer 105 as a reference layer. In this state, electrons are injected into the ferromagnetic layer 103 from the ferromagnetic layer 105.

Figure 8:
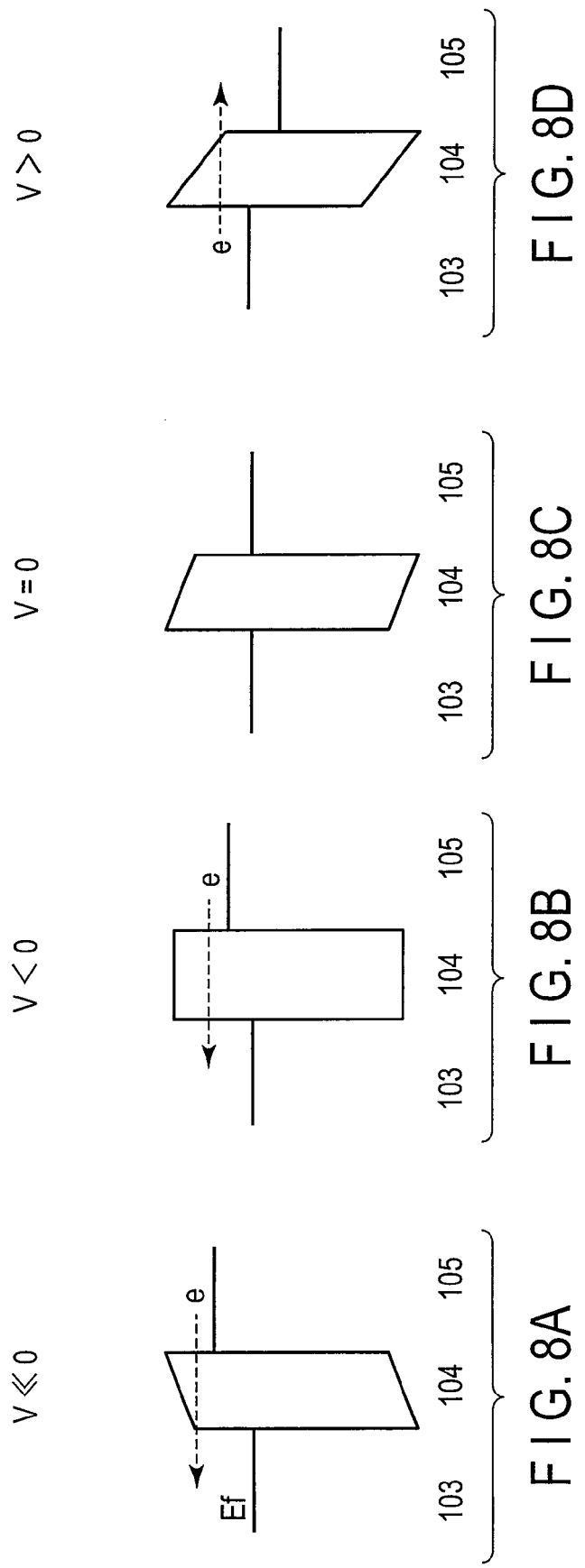
FIGS. 8A, 8B, 8C, and 8D are views showing the band structure when writing to the magnetoresistive effect element of the embodiment.

FIGS. 8A and 8B illustrate the band structure in an AP→P write in which a negative voltage is applied to the ferromagnetic layer 105. FIG. 8D shows the band structure in a P→AP write in which a positive voltage is applied to the ferromagnetic layer 105. FIG. 8C shows the band structure when the application voltage is zero. In FIGS. 8A, 8B, 8C, and 8D, the energy barrier height φ is larger on the side of the ferromagnetic layer 103 as a storage layer than on the side of the ferromagnetic layer 105 as a reference layer.

FIG. 9 is a graph showing the dependence of the resistance on the bias voltage in the antiparallel state (AP) and parallel state (P) of the magnetoresistive effect element.

As shown in FIG. 9, the absolute value of a necessary voltage is normally larger in a P→AP write (V>0) than in an AP→P write (V<0).

Assume that the energy barrier height φ on the side of the ferromagnetic layer (reference layer) 105 is decreased. In this case, FIG. 8D corresponds to a P→AP write (V>0). Since the energy barrier heights φ in the ferromagnetic layer (storage layer) 103 and ferromagnetic layer (reference layer) 105 are different, the band slope increases when the energy barrier height φ on the side of the ferromagnetic layer (reference layer) 105 decreases, and this facilitates the flow of a current. That is, the tunnel resistance in the antiparallel state decreases, and the dependence of the magnetoresistance ratio on the bias increases. By decreasing the energy barrier height φ on the side of the ferromagnetic layer 105, therefore, the dependence of the resistance on the bias voltage changes from the broken line to the solid line in FIG. 9, and this makes it possible to decrease the absolute value of the voltage required for a write.

Also, in FIGS. 8A and 8B corresponding to an AP→P write (V<0), the tunnel resistance in the antiparallel state is high, and the dependence of the magnetoresistance ratio on the bias voltage is small. Therefore, the effect of decreasing the absolute voltage necessary for a write is smaller than that in a P→AP write (V>0).

As described above, when the energy barrier is higher on the storage layer side than on the reference layer side, the voltage of a P→AP write can be decreased by lowering the energy barrier on the reference layer side. When the energy barrier relationship between the storage layer and reference layer is opposite, i.e., when the energy barrier is higher on the reference layer side than on the storage layer side, the voltage of a P→AP write can be decreased by lowering the energy barrier on the storage layer side.

These results demonstrate that in order to make the dependence of the MR ratio on the bias voltage clearly steep, as shown in FIG. 4B, it is preferable to add an element having a work function smaller by 0.3 eV or more than that of the base material of the ferromagnetic layer.

A typical write operating voltage is about 0.6 to 1.0 V, and a typical read operating voltage is about 0.1 to 0.3 V. Accordingly, to make the MR ratio at a write operating voltage of 0.6 to 1.0±0.5 V about half or less the MR ratio when the bias voltage is nearly zero, it is preferable to add an element having a work function smaller by 0.4 eV or more than that of the base material of the ferromagnetic layer. Furthermore, to make the MR ratio when the bias voltage is ±0.5 V about 40% or less the MR ratio when the bias voltage is nearly zero, it is preferable to add an element having a work function smaller by 0.5 eV or more than that of the base material of the ferromagnetic layer. When the base material of the ferromagnetic layer is a mixture, the work function of the base material of the ferromagnetic layer is the concentration weighted average of the work functions of constituent elements.

An example in which the barrier height ϕ is large will be explained as a comparative example with reference to FIGS. 10, 11A, 11B, 12A, 12B, and 12C.

FIG. 10 is a sectional view showing the structure of a magnetoresistive effect element of the comparative example.

As shown in FIG. 10, a ferromagnetic layer 103, tunnel barrier layer 104, ferromagnetic layer 105, and upper layer 106 are formed in this order on an underlayer 102. The upper layer 106 includes a metal layer 201 formed on the ferromagnetic layer 105, and an upper interconnection connecting layer 202 formed on the metal layer 201. The ferromagnetic layers 103 and 105 are made of, for example, CoFeB. The tunnel barrier layer 104 is made of, for example, MgO. The metal layer 201 is made of Pt.

FIGS. 11A and 11B are graphs showing the dependence of the MR ratio on the bias voltage and the dependence of the barrier resistance on the bias voltage, respectively, when Pt is used as the metal layer 201.

When the metal layer 201 is made of Pt, as shown in FIG. 11A, the dependence of the MR ratio on the bias voltage is asymmetrical with respect to the voltage: the dependence of the MR ratio on the bias voltage when voltage >0 is more moderate than that when voltage <0. Also, as shown in FIG. 11B, the barrier resistance Rap in the antiparallel state increases at a predetermined ratio as the voltage rises when voltage <0, and is almost constant or slightly increases when voltage >0. Referring to FIGS. 11A and 11B, the case in which the application voltage to the upper layer 106 of the magnetoresistive effect element shown in FIG. 10 is positive is defined as voltage >0.

FIGS. 12A, 12B, and 12C are schematic views showing the band structure corresponding to the MTJ element (the ferromagnetic layer 103, tunnel barrier layer 104, and ferromagnetic layer 105) when Pt is used as the metal layer 201.

The work function of Pt is larger than that of CoFeB contained in the ferromagnetic layers 103 and 105. When Pt is used as the metal layer 201, therefore, Pt diffuses to a portion of the ferromagnetic layer 105 in the vicinity of the tunnel barrier layer 104. Consequently, as shown in FIGS. 12A, 12B, and 12C, the Fermi-level energy decreases and the barrier height increases in the ferromagnetic layer 105. As shown in FIG. 12C, the band of the tunnel barrier layer 104 is horizontal when voltage >0. Therefore, as shown in FIG. 11B, the voltage at which the barrier resistance is maximum is higher than zero.

In this comparative example, Pt as a material having a large work function is doped in the ferromagnetic layer 105. Accordingly, when voltage >0, i.e., when electrons are injected into the tunnel barrier layer 104 from the side on which the barrier height is large, the dependence of the MR ratio on the bias voltage becomes moderate, in contrast to the object of this embodiment.

In this comparative example as described above, the dependence of the MR ratio on the bias voltage becomes moderate because a material having a large work function is doped in the ferromagnetic layer. This result indicates the possibility that the dependence of the MR ratio on the bias voltage becomes steep when a material having a small work function is doped in the ferromagnetic layer.

FIGS. 13, 14, 15, and 16 show the calculated work function differences between the ferromagnetic materials forming the base material of the ferromagnetic layer and the additive elements. In FIGS. 13, 14, 15, and 16, main components of the base material of the ferromagnetic layer are described in the uppermost row, and a work function corresponding to each component ratio is shown. Also, "the work function difference from the base material" is represented by "(work function of ferromagnetic layer base material)−(work function of additive element)".

The average work function of the base material of the ferromagnetic layer is the concentration weighted average of component elements forming the base material. As described above, the additive element preferably has a work function smaller by 0.3 eV or more than that of the base material of the ferromagnetic layer. It is preferable to add an element having a work function smaller by 0.4 eV or more than that of the base material of the ferromagnetic layer. It is more preferable to add an element having a work function smaller by 0.5 eV or more than that of the base material of the ferromagnetic layer. Note that the base material of the ferromagnetic layer may also be a material other than the materials shown in FIGS. 13, 14, 15, and 16. Note also that the base material of the ferromagnetic layer may also have a component ratio other than the component ratios shown in FIGS. 13, 14, 15, and 16.

"The work function difference from the base material" shown in FIGS. 13, 14, 15, and 16 need only be positive in accordance with a ferromagnetic layer base material to be used. It is possible to appropriately select an additive element having a work function difference of 0.3 eV or more as described above. The component ratios of the ferromagnetic layer base materials are, of course, not limited to the contents described in these tables. The work function differences between the ferromagnetic layer base materials and additive elements need only take positive values. Note that each of FIGS. 14 and 16 also shows the work function of Pt described in the comparative example in the lowermost row.

To significantly decrease the barrier height while suppressing the change in magnetism of the ferromagnetic layer caused by the doping of the additive element, the concentration of the ferromagnetic layer base material preferably exceeds 80%, and the concentration of the additive element is preferably 20% or less.

To decrease the barrier height to some extent while suppressing the change in magnetism of the ferromagnetic layer caused by the doping of the additive element, the concentration of the ferromagnetic layer base material more preferably exceeds 85%, and the concentration of the additive element is more preferably 15% or less. To minimize the change in magnetism of the ferromagnetic layer caused by the doping of the additive element, the concentration of the ferromagnetic layer base material most preferably exceeds 90%, and the concentration of the additive element is most preferably 10% or less.

Note that if a nonmagnetic element exceeding 20% is added to the ferromagnetic layer, the magnetization of the ferromagnetic layer significantly decreases, and the spin polarizability also significantly decreases. Accordingly, the magnetoresistance ratio presumably significantly decreases as well.

A method of manufacturing the magnetoresistive effect element of the embodiment will be explained below.

FIGS. 17, 18A, 18B, 18C, 19A, 19B, 19C, 20, 21, 22, 23, 24, and 25 are sectional views showing the steps of the manufacturing method of the magnetoresistive effect element of the embodiment.

First, as shown in FIG. 17, an underlayer 102, ferromagnetic layer 103, tunnel barrier layer 104, ferromagnetic layer 105, and upper layer 106 are formed in this order on a lower interconnect layer 101.

A mixed layer containing a base material as a main component of the ferromagnetic layer and an additive layer is applied as one or both of the ferromagnetic layers 103 and 105.

Alternatively, as shown in FIG. 18A, it is possible to form, as the ferromagnetic layer 103, a multilayered structure including a high-concentration layer 302 having a high additive element concentration and a low-concentration layer 301 having a low additive element concentration, and form, as the ferromagnetic layer 105, a multilayered structure including a high-concentration layer 303 having a high additive element concentration and a low-concentration layer 304 having a low additive element concentration. The layers 302 and 303 are arranged on the side of the tunnel barrier layer 104, and the layers 301 and 304 are arranged on the sides opposite to the tunnel barrier layer 104, i.e., on the sides of the underlayer 102 and upper layer 106, respectively. Note that the low-concentration layers 301 and 304 having a low additive element concentration may also be layers containing no additive element.

Alternatively, as shown in FIG. 18B, it is possible to form, as the ferromagnetic layer 103, a mixed layer containing the ferromagnetic layer base material and additive element, and form, as the ferromagnetic layer 105, a multilayered structure including a high-concentration layer 305 having a high additive element concentration and a low-concentration layer 306 having a low additive element concentration. The layer 305 is positioned on the side of the tunnel barrier layer 104, and the layer 306 is positioned on the side opposite to the tunnel barrier layer 104, i.e., on the side of the upper layer 106. Note that the low-concentration layer 306 having a low additive element concentration may also be a layer containing no additive element.

Alternatively, as shown in FIG. 18C, it is possible to form, as the ferromagnetic layer 103, a multilayered structure including high-concentration layer 308 having a high additive element concentration and a low-concentration layer 307 having a low additive element concentration, and form, as the ferromagnetic layer 105, a mixed layer containing the ferromagnetic layer base material and additive element. The layer 308 is positioned on the side of the tunnel barrier layer 104, and the layer 307 is positioned on the side opposite to the tunnel barrier layer 104, i.e., on the side of the underlayer 102. Note that the low-concentration layer 307 having a low additive element concentration may also be a layer containing no additive element.

Furthermore, as shown in FIG. 19A, it is possible to form, for both of the underlayer 102 and upper layer 106, a high-concentration layer having a high additive element concentration and a low-concentration layer having a low additive element concentration. That is, it is possible to form, as the underlayer 102, a multilayered structure including a high-concentration layer 402 having a high additive element concentration and a low-concentration layer 401 having a low additive element concentration, and form, as the upper layer 106, a multilayered structure including a high-concentration layer 403 having a high additive element concentration and a low-concentration layer 404 having a low additive element concentration. The layer 402 is positioned on the side of the ferromagnetic layer 103, and the layer 401 is positioned on the side opposite to the ferromagnetic layer 103. In addition, the layer 403 is positioned on the side of the ferromagnetic layer 105, and the layer 404 is positioned on the side opposite to the ferromagnetic layer 105. Note that the low-concentration layers 401 and 404 having a low additive element concentration may also be layers containing no additive element.

Alternatively, as shown in FIG. 19B, it is possible to form, for the upper layer 106 alone, a high-concentration layer having a high additive element concentration and a low-concentration layer having a low additive element concentration. That is, it is possible to form, as the upper layer 106, a multilayered structure including a high-concentration layer 405 having a high additive element concentration and a low-concentration layer 406 having a low additive element concentration. The layer 405 is positioned on the side of the ferromagnetic layer 105, and the layer 406 is positioned on the side opposite to the ferromagnetic layer 105. Note that the low-concentration layer 406 having a low additive element concentration may also be a layer containing no additive element.

Alternatively, as shown in FIG. 19C, it is possible to form, for the underlayer 102 alone, a high-concentration layer having a high additive element concentration and a low-concentration layer having a low additive element concentration. That is, it is possible to form, as the underlayer 102, a multilayered structure including a high-concentration layer 408 having a high additive element concentration and a low-concentration layer 407 having a low additive element concentration. The layer 408 is positioned on the side of the ferromagnetic layer 103, and the layer 407 is positioned on the side opposite to the ferromagnetic layer 103. Note that the low-concentration layer 407 having a low additive element concentration may also be a layer containing no additive element.

In the structures shown in FIGS. 19A, 19B, and 19C, the additive element is diffused in the ferromagnetic layers 103 and 105 in the heating steps after the underlayer 102 and upper layer 106 are deposited.

When depositing a film containing the additive element according to this embodiment by sputtering, it is possible to use a target containing the element alone, or an alloy target containing the additive element of this embodiment and an element having no influence on the magnetism of the ferromagnetic layer base material. Examples of the latter are targets of material mixtures of lanthanoid elements and boron, such as LaB, CeB, PrB, NdB, SmB, EuB, GdB, TbB, DyB, HoB, ErB, TmB, YbB, and LuB.

The tunnel barrier layer 104 can also be a single-layered film or multilayered film of a metal oxide such as MgO, $AlO_X$, ZnO, or $TaO_X$, a nitride, or an oxynitride, or a film of a mixture such as MgZnO.

Then, as shown in FIG. 20, the underlayer 102, ferromagnetic layer 103, tunnel barrier layer 104, ferromagnetic layer 105, and upper layer 106 on the lower interconnect layer 101 are selectively etched by, for example, ion milling. Consequently, an MTJ element including the ferromagnetic layer 103, tunnel barrier layer 104, and ferromagnetic layer 105 is formed.

After that, as shown in FIG. 21, an insulating layer 107 is formed to cover the MTJ element shown in FIG. 20 by, for example, sputtering, chemical vapor deposition (CVD), or atomic layer deposition (ALD), in order to protect the MTJ element in the next step. The insulating layer 107 is made of, for example, SiN, $SiO_X$, MgO, or $AlO_X$.

Subsequently, the lower interconnect layer 101 is selectively etched by, for example, reactive ion etching (RIE) (the processed portions of the lower interconnect layer 101 are not shown in FIG. 21 because they are positioned on, for example, the front and back sides of the drawing surface). In this step, the MTJ element is protected by the insulating layer 107 shown in FIG. 21.

After that, as shown in FIG. 22, an interlayer dielectric film 108 is formed on the insulating layer 107 and lower interconnect layer 101 by, for example, sputtering or CVD. Interlayer dielectric film 108 is made of, for example, $SiO_X$.

Then, as shown in FIG. 23, interlayer dielectric film 108 is polished by, for example, chemical mechanical polishing (CMP) or etched back by vapor phase etching, thereby exposing the upper surface of the upper layer 106 on the MTJ element.

Figure 24:
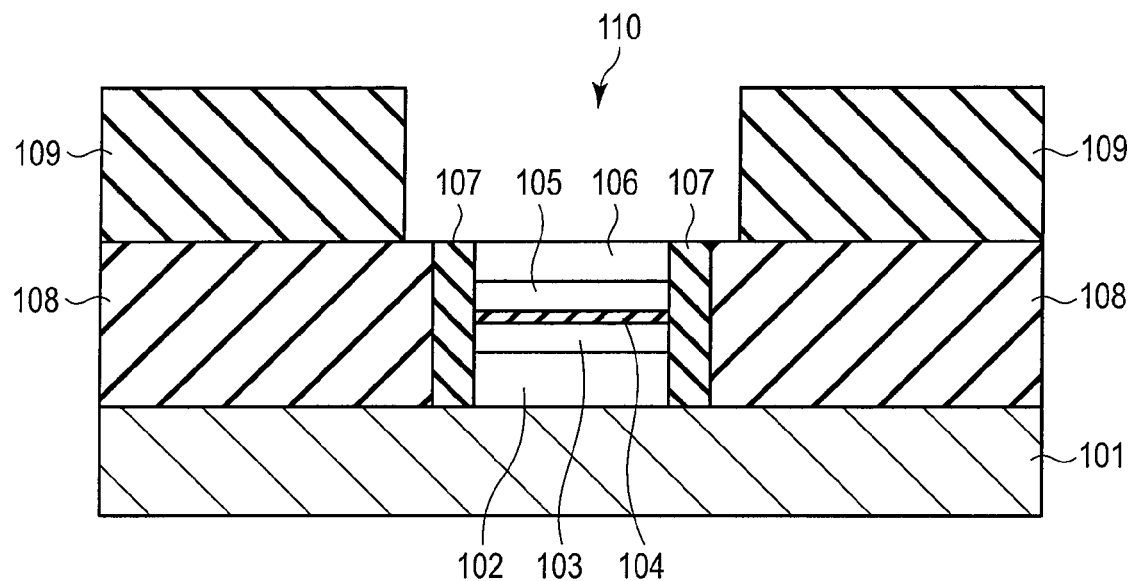

After that, as shown in FIG. 24, an interlayer dielectric film 109 is formed on the structure shown in FIG. 23. Subsequently, a contact hole 110 is formed above the MTJ element, i.e., above the upper layer 106 by RIE or the like. Interlayer dielectric film 109 is made of, for example, $SiO_X$.

Figure 25:
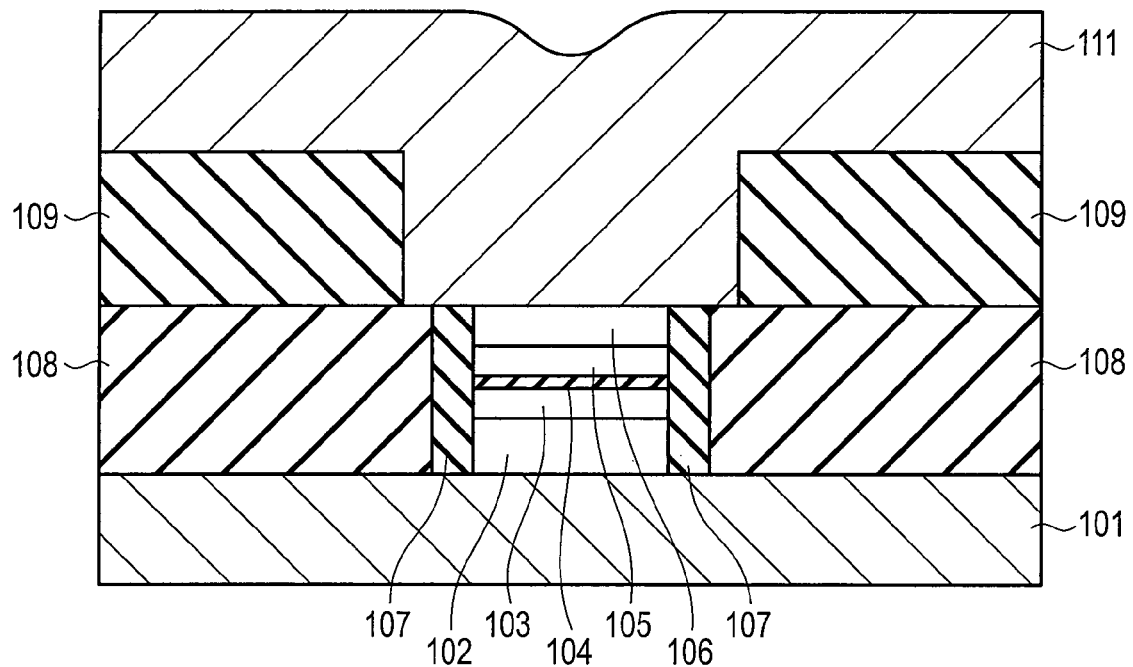

Then, as shown in FIG. 25, an upper interconnect layer 111 is formed on the structure shown in FIG. 24. The upper interconnect layer 111 is formed into the shape shown in FIG. 1 by selective etching performed by, for example, RIE. Thus, the magnetoresistive effect element of the embodiment is manufactured.

The way the additive element distribution in the ferromagnetic layer changes in accordance with the method of doping the additive element in the ferromagnetic layer will be explained below.

FIGS. 26A, 26B, and 26C are graphs showing the additive element distributions in the ferromagnetic layer, which correspond to three types of additive element doping methods according to this embodiment. The abscissa represents the thickness of the ferromagnetic layer, i.e., the distance from the interface between the tunnel barrier layer 104 and ferromagnetic layer 103 (or 105). The ordinate represents the additive element concentration in the ferromagnetic layer.

FIG. 26A shows a case in which a mixed layer containing the ferromagnetic layer base material and additive element is applied as both the ferromagnetic layers 103 and 105, as shown in FIG. 17. In the mixed layer containing the ferromagnetic layer base material and additive element, the additive element concentration is constant in the thickness direction of the ferromagnetic layer.

FIG. 26B shows a case in which, as shown in FIGS. 18A, 18B, and 18C, a high-concentration layer having a high additive element concentration is formed on the side of the tunnel barrier layer 104, and a layer having a low additive element concentration or a layer containing no additive element is formed on the side opposite to the tunnel barrier layer 104. The additive element concentration rises near the tunnel barrier layer 104 and falls in the direction away from the tunnel barrier layer 104. For example, the concentration distribution is formed such that the additive element concentration in a region of 0.5 nm or less from the interface of the ferromagnetic layer on the tunnel barrier layer side is higher by 1% or more than that in a region exceeding 0.5 nm from the interface on the tunnel barrier layer side.

FIG. 26C shows a case in which, as shown in FIGS. 19A, 19B, and 19C, a layer containing the additive element is formed on the side of the ferromagnetic layer, which is opposite to the tunnel barrier layer 104. Since the additive element is diffused in the ferromagnetic layer 103 (or 105) in the heating step after deposition, the additive element concentration rises in the direction away from the tunnel barrier layer 104. For example, the concentration distribution is formed such that the additive element concentration in a region of 0.5 nm or less from the interface of the ferromagnetic layer on the tunnel barrier layer side is lower by 1% or more than that in a region exceeding 0.5 nm from the interface on the tunnel barrier layer side.

In this embodiment, the barrier height of the tunnel barrier is decreased by doping, in the ferromagnetic layer base material, an additive element having a work function smaller than that of the base material. This can make the dependence of the magnetoresistance ratio on the bias voltage steep. Consequently, it is possible to implement a magnetoresistive effect element in which the MR ratio is high at a low read voltage and low at a high write voltage, i.e., in which the operating voltage is reduced.

As has been explained above, the embodiment can provide a magnetoresistive effect element in which the dependence of the magnetoresistance ratio on the bias voltage is steep.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetoresistive effect element comprising:
   a first ferromagnetic layer having a variable magnetization direction;
   a second ferromagnetic layer having an invariable magnetization direction; and
   a tunnel barrier layer formed between the first ferromagnetic layer and the second ferromagnetic layer,
   wherein an energy barrier between the first ferromagnetic layer and the tunnel barrier layer is higher than an energy barrier between the second ferromagnetic layer and the tunnel barrier layer, and
   wherein the second ferromagnetic layer contains a main component and an additive element, the main component contains at least one of Fe, Co, and Ni, and the additive element contains at least one of Mg, Al, Ca, Sc, Ti, V, Mn, Zn, As, Sr, Y, Zr, Nb, Cd, In, Ba, La, Ce, Pr, Nd, Sm, Eu, Gd, Tb, Dy, Ho, Er, Tm, Yb, Lu, Hf, Ta, and W, wherein the first ferromagnetic layer contains the additive element, and wherein an amount of the additive element contained in the second ferromagnetic layer is larger than that of the additive element contained in the first ferromagnetic layer.

2. The element according to claim 1, wherein a content of the additive element in an interface between the second ferromagnetic layer and the tunnel barrier layer is larger than that of the additive element in an interface between the first ferromagnetic layer and the tunnel barrier layer.

3. The element according to claim 1, wherein the additive element has a work function smaller than a concentration weighted average of a work function of the main component.

4. The element according to claim 3, wherein the additive element has a work function smaller by at least 0.3 eV than the concentration weighted average of the work function of the main component.

5. The element according to claim 1, wherein in the second ferromagnetic layer, a concentration of the main component is not less than 80%, and a concentration of the additive element is not more than 20%.

6. The element according to claim 1, wherein a positive bias is applied to the second ferromagnetic layer when performing a write operation in which the magnetization directions in the first ferromagnetic layer and the second ferromagnetic layer are changed from a parallel state to an antiparallel state.

7. The element according to claim 1, further comprising an insulating layer formed on side surfaces of the first ferromagnetic layer, the second ferromagnetic layer, and the tunnel barrier layer.

8. The element according to claim 1, wherein the first ferromagnetic layer, the second ferromagnetic layer, and the tunnel barrier layer form a magnetic tunnel junction (MTJ) element.

9. A magnetoresistive effect element comprising:
a first ferromagnetic layer;
a second ferromagnetic layer; and
a tunnel barrier layer formed between the first ferromagnetic layer and the second ferromagnetic layer, wherein at least one of the first ferromagnetic layer and the second ferromagnetic layer contains a main component containing at least one of Fe, Co, and Ni, and an additive element having a work function smaller than a concentration weighted average of a work function of the main component, wherein both the first ferromagnetic layer and the second ferromagnetic layer contain the additive element, and wherein an amount of the additive element contained in the second ferromagnetic layer is larger than that of the additive element contained in the first ferromagnetic layer.

10. The element according to claim 9, wherein the additive element contains at least one of Mg, Al, Ca, Sc, Ti, V, Mn, Zn, As, Sr, Y, Zr, Nb, Cd, In, Ba, La, Ce, Pr, Nd, Sm, Eu, Gd, Tb, Dy, Ho, Er, Tm, Yb, Lu, Hf, Ta, and W.

11. The element according to claim 9, wherein a content of the additive element in an interface between the second ferromagnetic layer and the tunnel barrier layer is larger than that of the additive element in an interface between the first ferromagnetic layer and the tunnel barrier layer.

12. The element according to claim 9, wherein the additive element has a work function smaller by at least 0.3 eV than the concentration weighted average of the work function of the main component.

13. The element according to claim 9, wherein in one of the first ferromagnetic layer and the second ferromagnetic layer, a concentration of the main component is not less than 80%, and a concentration of the additive element is not more than 20%.

14. The element according to claim 9, wherein a positive bias is applied to the second ferromagnetic layer when performing a write operation in which magnetization directions in the first ferromagnetic layer and the second ferromagnetic layer are changed from a parallel state to an antiparallel state.

15. The element according to claim 9, further comprising an insulating layer formed on side surfaces of the first ferromagnetic layer, the second ferromagnetic layer, and the tunnel barrier layer.

16. The element according to claim 9, wherein the first ferromagnetic layer, the second ferromagnetic layer, and the tunnel barrier layer form a magnetic tunnel junction (MTJ) element.

* * * * *